（12）United States Patent
Campbell et al.

(10) Patent No.: US 9,213,343 B2
(45) Date of Patent: Dec. 15, 2015

(54) EFFECTIVENESS-WEIGHTED CONTROL METHOD FOR A COOLING SYSTEM

(71) Applicant: INTERNATIONAL BUSINESS MACHINES CORPORATION, Armonk, NY (US)

(72) Inventors: Levi A. Campbell, Poughkeepsie, NY (US); Richard C. Chu, Hopewell Junction, NY (US); Milnes P. David, Fishkill, NY (US); Michael J. Ellsworth, Jr., Lagrangeville, NY (US); Madhusudan K. Iyengar, Foster City, CA (US); Roger R. Schmidt, Poughkeepsie, NY (US); Robert E. Simons, Poughkeepsie, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 278 days.

(21) Appl. No.: 13/783,618

(22) Filed: Mar. 4, 2013

(65) Prior Publication Data
US 2014/0163767 A1 Jun. 12, 2014

Related U.S. Application Data

(63) Continuation of application No. 13/706,543, filed on Dec. 6, 2012.

(51) Int. Cl.
G05D 23/19 (2006.01)
H05K 7/20 (2006.01)

(52) U.S. Cl.
CPC .......... *G05D 23/1932* (2013.01); *H05K 7/2079* (2013.01); *H05K 7/20836* (2013.01)

(58) Field of Classification Search
CPC .................. H05K 7/2019; G05D 23/1932
See application file for complete search history.

(56) References Cited

U.S. PATENT DOCUMENTS 5,462,225 A 10/1995 Massara et al.
6,134,667 A * 10/2000 Suzuki et al. ................. 713/300
(Continued)

FOREIGN PATENT DOCUMENTS

JP 2011-040083 A 2/2011

OTHER PUBLICATIONS

IBM Technical Disclosure, "System and Method to Schedule Jobs Within a Data Center Based on Current and Future Temperature Distributions", Oct. 6, 2009.
(Continued)

Primary Examiner — Kenneth M Lo
Assistant Examiner — Geoffrey Wellman
(74) Attorney, Agent, or Firm — Steven Chiu, Esq.; Kevin P. Radigan, Esq.; Heslin Rothenberg Farley & Mesiti P.C.

(57) ABSTRACT

Energy efficient control of cooling system cooling of an electronic system is provided based, in part, on weighted cooling effectiveness of the components. The control includes automatically determining speed control settings for multiple adjustable cooling components of the cooling system. The automatically determining is based, at least in part, on weighted cooling effectiveness of the components of the cooling system, and the determining operates to limit power consumption of at least the cooling system, while ensuring that a target temperature associated with at least one of the cooling system or the electronic system is within a desired range by provisioning, based on the weighted cooling effectiveness, a desired target temperature change among the multiple adjustable cooling components of the cooling system. The provisioning includes provisioning applied power to the multiple adjustable cooling components via, at least in part, the determined control settings.

7 Claims, 15 Drawing Sheets

(56) References Cited

U.S. PATENT DOCUMENTS

| | | | |
|---|---|---|---|
| 6,775,137 | B2 | 8/2004 | Chu et al. |
| 6,868,682 | B2 | 3/2005 | Sharma et al. |
| 8,127,298 | B2 | 2/2012 | Kato et al. |
| 2003/0011984 | A1* | 1/2003 | Chu et al. ............... 361/687 |
| 2003/0067745 | A1* | 4/2003 | Patel et al. .............. 361/690 |
| 2006/0121421 | A1 | 6/2006 | Spitaels et al. |
| 2007/0049134 | A1* | 3/2007 | Conroy et al. ............ 439/894 |
| 2008/0238607 | A1* | 10/2008 | Schuricht et al. .......... 340/3.1 |
| 2009/0259345 | A1 | 10/2009 | Kato et al. |
| 2011/0082599 | A1 | 4/2011 | Shinde et al. |
| 2011/0107332 | A1 | 5/2011 | Bash |
| 2011/0301911 | A1 | 12/2011 | VanGilder et al. |
| 2014/0163764 | A1 | 6/2014 | Campbell et al. |

OTHER PUBLICATIONS

Hamann et al., "Thermal Zones for More Efficient Data Center Energy Management", 2010 12th IEEE Intersociety Conference on Thermal and Thermomechanical Phenomena in Electronic Systems (ITherm) (2010).

Li et al., "ThermoCast: A Cyber-Physical Forecasting Model for Data Centers", In: KDDACM, pp. 1370-1378 (2011).

Wang et al., "Task Scheduling with ANN-Based Temperature Prediction in a Data Center: A Simulation-Based Study", Engineering with Computers, vol. 27, pp. 381-391 (2011).

Iyengar et al., "Server Liquid with Chiller-Less Data Center Design to Enable Significant Energy Savings", 2012 28th Annual IEEE Conference on Semiconductor Thermal Measurement and Management Symposium (SEMI-THERM), pp. 212-223 (2012).

Campbell et al., "Effectiveness-Weighted Control of Cooling System Components", U.S. Appl. No. 13/706,543, filed Dec. 6, 2012.

Hamann et al., "Thermal Zones for More Efficient Data Center Energy Management", 2010 12th IEEE Intersociety Conference on Thermal and Thermomechanical Phenomena in Electronic Systems (ITherm) (Jun. 2-5, 2010).

Wang et al., "Task Scheduling with ANN-Based Temperature Prediction in a Data Center: A Simulation-Based Study", Engineering with Computers, vol. 27, pp. 381-391 (Oct. 1, 2011).

Campbell et al., Office Action for U.S. Appl. No. 13/706,543, filed Dec. 6, 2012 (U.S. Patent Publication No. 2014/0163764 A1), dated Feb. 3, 2015 (18 pages).

Campbell et al., Office Action for U.S. Appl. No. 13/706,543, filed Dec. 6, 2012 (U.S. Patent Publication No. 2014/0163764 A1), dated May 26, 2015 (19 pages).

* cited by examiner

| COOLING COMPONENT # | S | X | G | I (OPTIONAL) | D (OPTIONAL) |
|---|---|---|---|---|---|
| 1 | $S_1$ | $X_1$ | $G_1$ | $I_1$ | $D_1$ |
| 2 | $S_2$ | $X_2$ | $G_2$ | $I_2$ | $D_2$ |
| ⋮ | ⋮ | ⋮ | ⋮ | ⋮ | ⋮ |
| N | $S_N$ | $X_N$ | $G_N$ | $I_N$ | $D_N$ |

FIG. 10A

| COOLING COMPONENT # | RPM RANGE | F | S | G | I (OPT) | D (OPT) |
|---|---|---|---|---|---|---|
| 1 | $RPM_{1,1}$ TO $RPM_{1,2}$ | $F_{1,1}$ | $S_{1,1}$ | $G_1$ | $I_1$ | $D_1$ |
| | ⋮ | ⋮ | ⋮ | ⋮ | ⋮ | ⋮ |
| | $RPM_{1,M}$ TO $RPM_{1,M+1}$ | $F_{1,M}$ | $S_{1,M}$ | $G_1$ | $I_1$ | $D_1$ |
| 2 | $RPM_{2,1}$ TO $RPM_{2,2}$ | $F_{2,1}$ | $S_{2,1}$ | $G_2$ | $I_2$ | $D_2$ |
| | ⋮ | ⋮ | ⋮ | ⋮ | ⋮ | ⋮ |
| | $RPM_{2,M}$ TO $RPM_{2,M+1}$ | $F_{2,M}$ | $S_{2,M}$ | $G_2$ | $I_2$ | $D_2$ |
| ⋮ | ⋮ | ⋮ | ⋮ | ⋮ | ⋮ | ⋮ |
| N | $RPM_{N,1}$ TO $RPM_{N,2}$ | $F_{N,1}$ | $S_{N,1}$ | $G_N$ | $I_N$ | $D_N$ |
| | ⋮ | ⋮ | ⋮ | ⋮ | ⋮ | ⋮ |
| | $RPM_{N,M}$ TO $RPM_{N,M+1}$ | $F_{N,M}$ | $S_{N,M}$ | $G_N$ | $I_N$ | $D_N$ |

FIG. 10B

| COOLING COMPONENT # | G | I (OPTIONAL) | D (OPTIONAL) |
|---|---|---|---|
| 1 | $G_1$ | $I_1$ | $D_1$ |
| 2 | $G_2$ | $I_2$ | $D_2$ |
| ⋮ | ⋮ | ⋮ | ⋮ |
| N | $G_N$ | $I_N$ | $D_N$ |

FIG. 12

EFFECTIVENESS-WEIGHTED CONTROL METHOD FOR A COOLING SYSTEM

CROSS-REFERENCE TO RELATED APPLICATION

This application is a continuation of U.S. Ser. No. 13/706,543, filed Dec. 6, 2012, and entitled "Effectiveness-Weighted Control of Cooling System Components", and which is hereby incorporated herein by reference in its entirety.

STATEMENT REGARDING FEDERALLY SPONSORED RESEARCH

This invention was made with Government support under Contract No. DEEE0002894, awarded by the Department of Energy. Accordingly, the U.S. Government has certain rights in the invention.

BACKGROUND

As is known, operating electronic components, such as electronic devices or systems, produce heat. This heat should be removed in order to maintain device junction temperatures within desirable limits, with failure to remove heat effectively resulting in increased device temperatures, and potentially leading to thermal runaway conditions. Several trends in the electronics industry have combined to increase the importance of thermal management, including heat removal for electronic devices, including technologies where thermal management has traditionally been less of a concern, such as CMOS. In particular, the need for faster and more densely packed circuits has had a direct impact on the importance of thermal management. For example, power dissipation, and therefore heat production, increases as device operating frequencies increase. Also, increased operating frequencies may be possible at lower device junction temperatures. Further, as more and more devices are packed onto a single chip, heat flux (Watts/cm$^2$) increases, resulting in the need to remove more power from a given size chip or module. These trends have combined to create applications where it is no longer desirable to remove heat from modern devices, and electronic systems containing such devices, solely by traditional air cooling methods, such as by using air cooled heat sinks with heat pipes or vapor chambers. Such air cooling techniques are inherently limited in their ability to extract heat from electronic components with moderate to high power density.

BRIEF SUMMARY

In one aspect, the shortcomings of the prior art are overcome and additional advantages are provided through the provision of a method of controlling cooling of an electronic system. The method includes: automatically determining control settings for multiple adjustable cooling components of a cooling system cooling the electronic system, the automatically determining being based, at least in part, on weighted cooling effectiveness of the multiple adjustable cooling components of the cooling system; and wherein the automatically determining operates to limit power consumption of at least the cooling system, while ensuring that a target temperature associated with at least one of the cooling system or the electronic system is within a desired range by provisioning, based at least in part on the weighted cooling effectiveness, a desired target temperature change among the multiple adjustable cooling components, the provisioning including provisioning applied power to the multiple adjustable cooling components via, at least in part, the determined control settings.

Additional features and advantages are realized through the techniques of the present invention. Other embodiments and aspects of the invention are described in detail herein and are considered a part of the claimed invention.

BRIEF DESCRIPTION OF THE SEVERAL VIEWS OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

FIG. 10A depicts one example of a pre-populated look up table facilitating single range speed control of a cooling component n of a cooling system, in accordance with one or more aspects of the present invention;

FIG. 10B depicts one example of a pre-populated lookup table facilitating piecewise range speed control of multiple cooling components n of the cooling system, where each cooling component n may have a different number of sub-ranges or pieces M, in accordance with one or more aspects of the present invention;

FIG. 12 depicts one embodiment of a lookup table for differential speed control of the multiple adjustable cooling components of a cooling system, in accordance with one or more aspects of the present invention;

DETAILED DESCRIPTION

Figure 1:
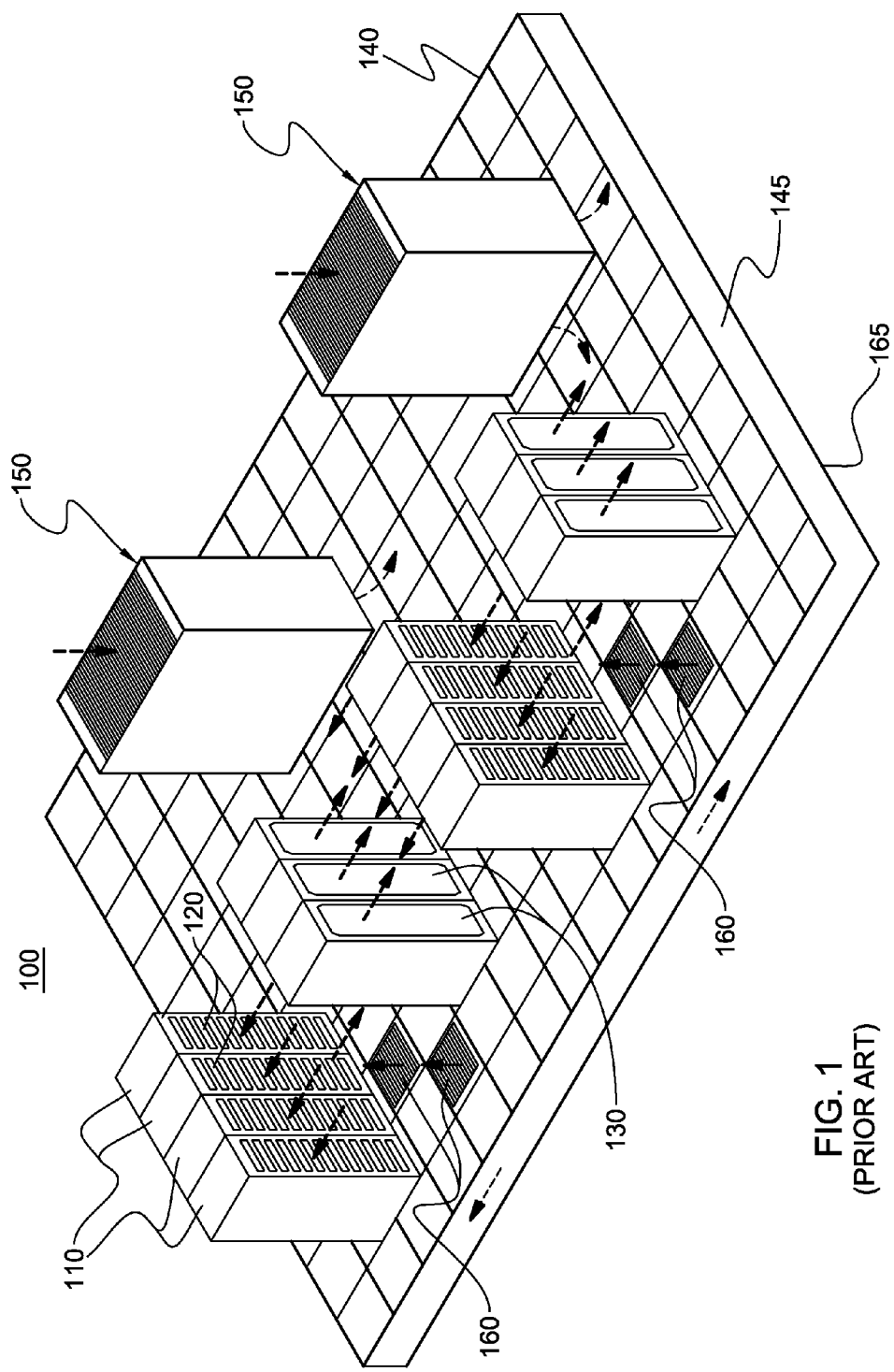
FIG. 1 depicts one embodiment of a conventional raised floor layout of an air-cooled data center.

As used herein, the terms "electronics rack", and "rack unit" are used interchangeably, and unless otherwise specified include any housing, frame, rack, compartment, blade server system, etc., having one or more heat-generating components of a computer system or electronic system, and may be, for example, a stand-alone computer processor having high, mid or low end processing capability. In one embodiment, an electronics rack may comprise a portion of an electronic system, a single electronic system or multiple electronic systems, for example, in one or more sub-housings, blades, books, drawers, nodes, compartments, etc., having one or more heat-generating electronic components disposed therein. An electronic system(s) may be movable or fixed, for example, relative to an electronics rack, with rack-mounted electronic drawers and blades of a blade center system being two examples of electronic systems (or subsystems) of an electronics rack to be cooled.

"Electronic component" refers to any heat-generating electronic component of, for example, a computer system or other electronic system requiring cooling. By way of example, an electronic component may comprise one or more integrated circuit dies, and/or other electronic devices to be cooled, such as one or more electronics cards. In one implementation, an electronics card may comprise a plurality of memory modules (such as one or more dual in-line memory modules (DIMMs)).

Further, as used herein, the terms "coolant-cooled structure", "coolant-cooled cold plate" and "coolant-cooled cold rail" refer to structures having one or more channels (or passageways) formed therein or passing therethrough, which facilitate the flow of coolant (such as liquid coolant) through the structure. A coolant-cooled structure may be, for example, a coolant-cooled cold plate, or a coolant-cooled cold rail, or a coolant manifold. In one example, tubing is provided extending through the coolant-cooled structure. An "air-to-coolant heat exchanger" or "air-to-coolant heat exchange assembly" means any heat exchange mechanism characterized as described herein through which coolant can circulate; and includes, one or more discrete air-to-coolant heat exchangers coupled either in series or in parallel. An air-to-coolant heat exchanger may comprise, for example, one or more coolant flow paths, formed of thermally conductive tubing (such as copper or other tubing) in thermal or mechanical contact with a plurality of air-cooled cooling fins. Size, configuration and construction of the air-to-coolant heat exchanger can vary without departing from the scope of the invention disclosed. Still further, "data center" refers to a computer installation containing one or more electronics racks to be cooled. As a specific example, a data center may comprise one or more rows of rack-mounted computer units, such as server units.

One example of coolant used within the cooling systems and cooled electronic systems disclosed herein is water. However, the concepts presented are readily adapted to use with other types of coolant. For example, the coolant may comprise a brine, a glycol mixture, a fluorocarbon liquid, or other coolant, or refrigerant, while still maintaining the advantages and unique features of the present invention.

Reference is made below to the drawings, which are not drawn to scale for ease of understanding, wherein the same reference numbers used throughout different figures designate the same or similar components.

FIG. 1 depicts a raised floor layout of an air cooled data center 100 typical in the prior art, wherein multiple electronics racks 110 are disposed in one or more rows. A data center such as depicted in FIG. 1 may house several hundred, or even several thousand microprocessors. In the arrangement illustrated, chilled air enters the computer room via perforated floor tiles 160 from a supply air plenum 145 defined between the raised floor 140 and a base or sub-floor 165 of the room. Cooled air is taken in through louvered covers at air inlet sides 120 of the electronics racks and expelled through the back (i.e., air outlet sides 130) of the electronics racks. Each electronics rack 110 may have one or more air moving devices (e.g., fans or blowers) to provide forced inlet-to-outlet airflow to cool the electronic devices within the rack unit. The supply air plenum 145 provides conditioned and cooled air to the air-inlet sides of the electronics racks via perforated floor tiles 160 disposed in a "cold" aisle of the computer installation. The conditioned and cooled air is supplied to plenum 145 by one or more air conditioning units 150, also disposed within the data center 100. Room air is taken into each air conditioning unit 150 near an upper portion thereof. This room air may comprise, in part, exhausted air from the "hot" aisles of the computer installation defined, for example, by opposing air outlet sides 130 of the electronics racks 110.

Figure 2:
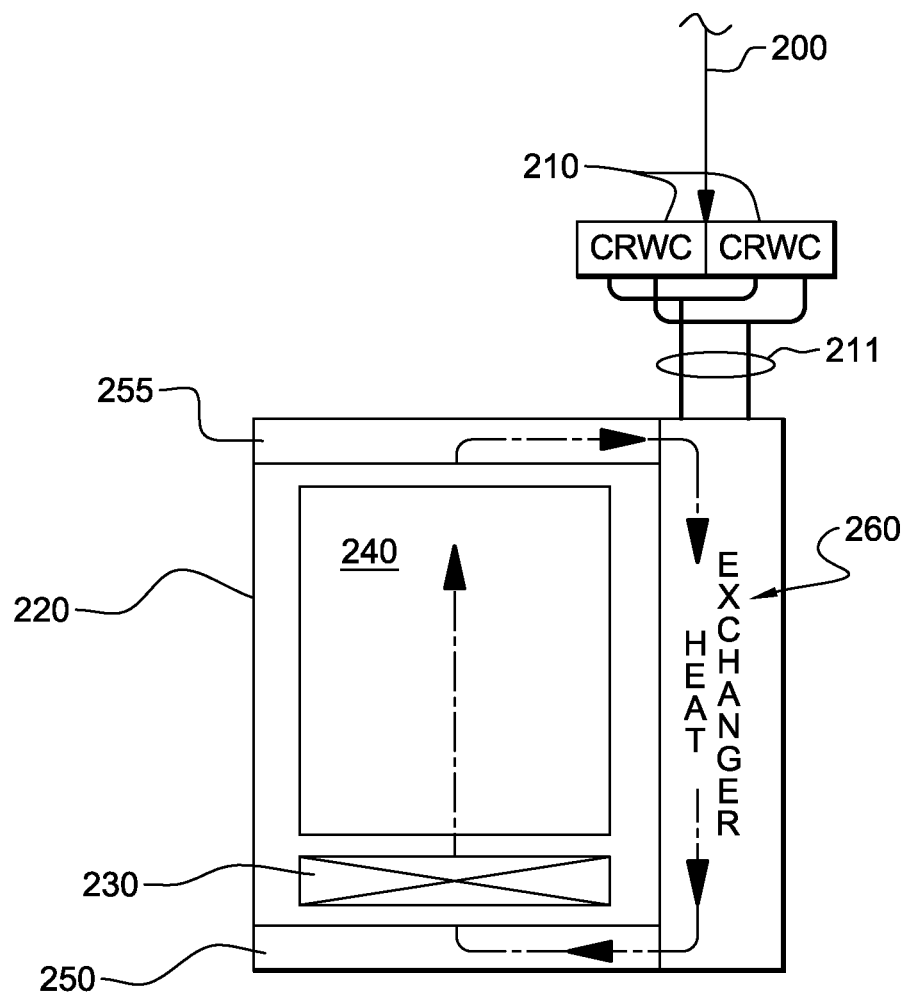
FIG. 2 is a cross-sectional plan view of one embodiment of an electronics rack with an attached air-to-liquid heat exchanger enhancing cooling of air passing through the electronics rack.
Figure 3:
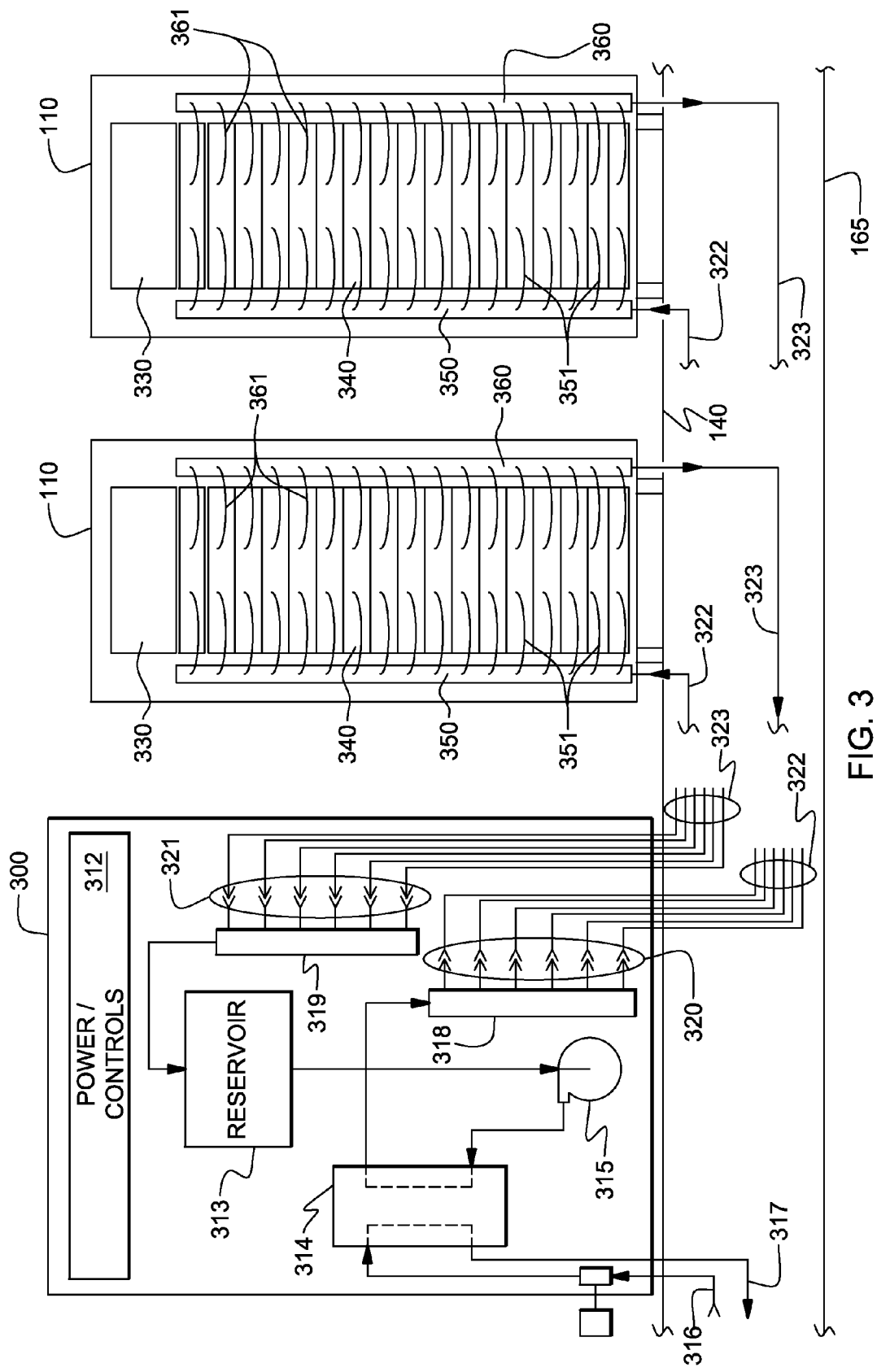
FIG. 3 depicts one embodiment of a data center with a coolant distribution unit facilitating liquid-cooling of one or more coolant-cooled electronics racks of the data center, in accordance with one or more aspects of the present invention.
Figure 4:
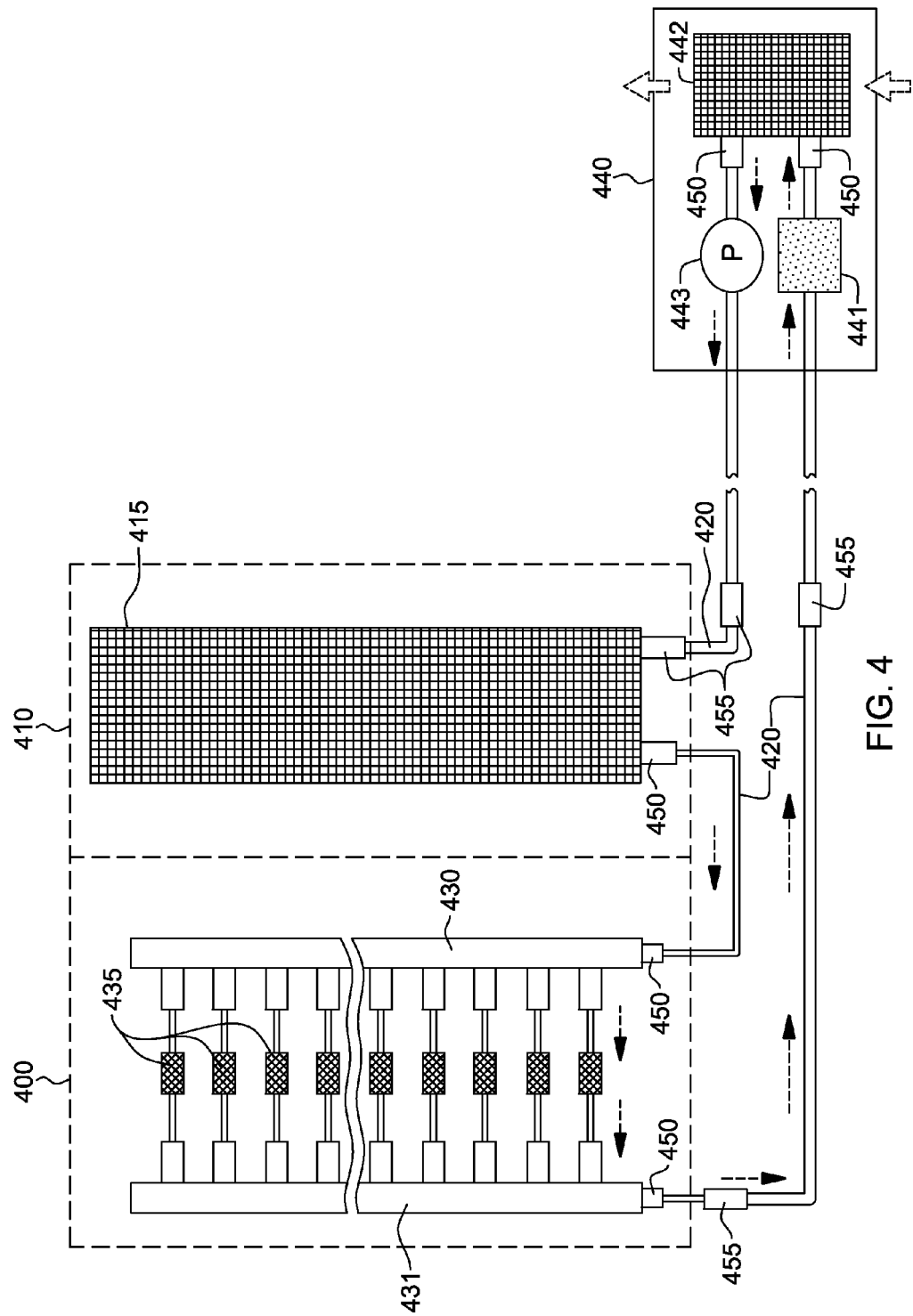
FIG. 4 depicts an alternate embodiment of a cooling system and coolant-cooled electronics system, in accordance with one or more aspects of the present invention.

Due to ever-increasing air flow requirements through electronics racks, and the limits of air distribution within a typical data center installation, liquid-coolant-based cooling is being combined with conventional air-cooling. FIGS. 2-4 illustrate various embodiments of a data center implementation employing such a coolant-based cooling system.

FIG. 2 depicts one rack-level coolant-cooling solution which utilizes (by way of example) chilled facility water to remove heat from the computer installation room, thereby transferring the cooling burden from the air-conditioning unit(s) to the building's chilled water coolers. The embodiment depicted in FIG. 2 is described in detail in commonly assigned, U.S. Pat. No. 6,775,137. Briefly summarized, facility-chilled water 200 circulates through one or more liquidto-liquid heat exchangers 210, coupled via a system coolant loop 211, to individual electronics racks 220 within the computer room. Rack unit 220 includes one or more air-moving devices 230 for moving air flow from an air inlet side to an air outlet side across one or more drawer units 240 containing heat-generating electronic components to be cooled. In this embodiment, a front cover 250 attached to the rack covers the air inlet side, a back cover 255 attached to the rack covers the air outlet side, and a side car disposed adjacent to (and/or attached to) the rack includes a heat exchanger 260 for cooling air circulating through the rack unit. Further, in this embodiment, the liquid-to-liquid heat exchangers 210 are multiple computer room water-conditioning (CRWC) units which are coupled to receive building chilled facility water 200. The building chilled facility water is used to cool the system coolant within system coolant loop 211, which is circulating through air-to-liquid heat exchanger 260. The rack unit in this example is assumed to comprise a substantially enclosed housing, wherein the same air circulates through the housing that passes across the air-to-liquid heat exchanger 260. In this manner, heat generated within the electronics rack is removed from the enclosed housing via the system coolant loop, and transferred to the facility coolant loop for removal from the computer installation room.

FIG. 3 depicts another embodiment of a rack-level, coolant-cooling solution, which again uses chilled facility water to remove heat from the computer installation room, thereby transferring the cooling burden from the air-conditioning unit(s) to the building's chilled water coolers. In this implementation, one embodiment of a coolant distribution unit 300 for a data center is illustrated. Within coolant distribution unit 300 is a power/control element 312, a reservoir/expansion tank 313, a liquid-to-liquid heat exchanger 314, a pump 315 (often accompanied by a redundant second pump), facility water inlet 316 and outlet 317 supply pipes, a supply manifold 318 supplying water or system coolant to the electronics racks 110 via couplings 320 and lines 322, and a return manifold 319 receiving water or system coolant from the electronics racks 110, via lines 323 and couplings 321. Each electronics rack includes (in one example) a power/control unit 330 for the electronics rack, multiple electronic systems or subsystems 340, a system coolant supply manifold 350, and a system coolant return manifold 360. As shown, each electronics rack 110 is disposed on raised floor 140 of the data center with lines 322 providing system coolant to system coolant supply manifolds 350 and lines 323 facilitating return of system coolant from system coolant return manifolds 360 being disposed in the supply air plenum beneath the raised floor.

In the embodiment illustrated, system coolant supply manifold 350 provides system coolant to cooling apparatuses disposed within the electronic systems or subsystems (for example, to coolant-cooled cold plates or cold rails) via flexible hose connections 351, which are disposed between the supply manifold and the respective electronic systems within the rack. Similarly, system coolant return manifold 360 is coupled to the electronic systems via flexible hose connections 361. Quick connect couplings may be employed at the interface between flexible hoses 351, 361 and the individual electronic systems. By way of example, these quick connect couplings may comprise various types of commercially available quick connect/disconnect couplings.

Although not shown, electronics rack 110 may also include an air-to-coolant heat exchanger, for example, disposed at an air outlet side thereof, which also receives system coolant from the system coolant supply manifold 350 and returns system coolant to the system coolant return manifold 360.

FIG. 4 illustrates another embodiment of a coolant-cooled electronics rack and cooling system therefor, in accordance with one or more aspects of the present invention. In this embodiment, the electronics rack 400 has a side car structure 410 associated therewith or attached thereto, which includes an air-to-coolant heat exchanger 415 through which air circulates from an air outlet side of electronics rack 400 towards an air inlet side of electronics rack 400, for example, in a closed loop path in a manner similar to that illustrated above in connection with the cooling implementation of FIG. 2. In this example, the cooling system comprises an economizer-based, warm-liquid coolant loop 420, which comprises multiple coolant tubes (or lines) connecting, in the example depicted, air-to-coolant heat exchanger 415 in series fluid communication with a coolant supply manifold 430 associated with electronics rack 400, and connecting in series fluid communication, a coolant return manifold 431 associated with electronics rack 400, a cooling unit 440 of the cooling system, and air-to-coolant heat exchanger 415.

As illustrated, coolant flowing through warm-liquid coolant loop 420, after circulating through air-to-coolant heat exchanger 415, flows via coolant supply plenum 430 to one or more electronic systems of electronics rack 400, and in particular, one or more cold plates and/or cold rails 435 associated with the electronic systems, before returning via coolant return manifold 431 to warm-liquid coolant loop 420, and subsequently to a cooling unit 440 disposed (for example) outdoors from the data center. In the embodiment illustrated, cooling unit 440 includes a filter 441 for filtering the circulating coolant, a condenser (or air-to-coolant heat exchanger) 442 for removing heat from the coolant, and a pump 443 for returning the coolant through warm-liquid coolant loop 420 to air-to-coolant heat exchanger 415, and subsequently to the coolant-cooled electronics rack 400. By way of example, hose barb fittings 450 and quick disconnect couplings 455 may be employed to facilitate assembly or disassembly of warm-liquid coolant loop 420.

In one example of the warm coolant-cooling approach of FIG. 4, outside ambient temperature might be 30° C., and coolant temperature 35° C. leaving the air-to-coolant heat exchanger 442 of the cooling unit. The cooled electronic system depicted thus facilitates a chiller-less data center. Advantageously, such a coolant-cooling solution provides highly energy efficient cooling of the electronic system(s) of the electronics rack, using coolant (e.g., water), that is cooled via circulation through the air-to-coolant heat exchanger located outdoors (i.e., a dry cooler) with external ambient air being pumped through the dry cooler. Note that this warm coolant-cooling approach of FIG. 4 is presented by way of example only. In alternate approaches, cold coolant-cooling could be substituted for the cooling unit 440 depicted in FIG. 4. Such cold coolant-cooling might employ building chilled facility coolant to cool the coolant flowing through the coolant-cooled electronics rack, and associated air-to-coolant heat exchanger (if present), in a manner such as described above in connection with FIGS. 2 & 3.

Figure 5B:
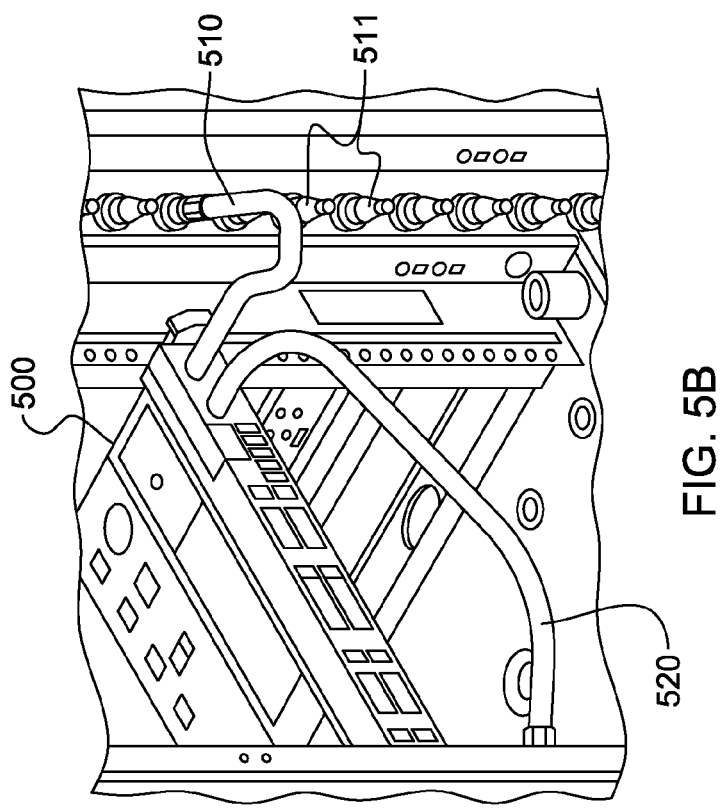
FIG. 5B is a partial depiction of a more detailed embodiment of the rack-level coolant distribution structures illustrated in FIG. 5A, in accordance with one or more aspects of the present invention.
Figure 5A:
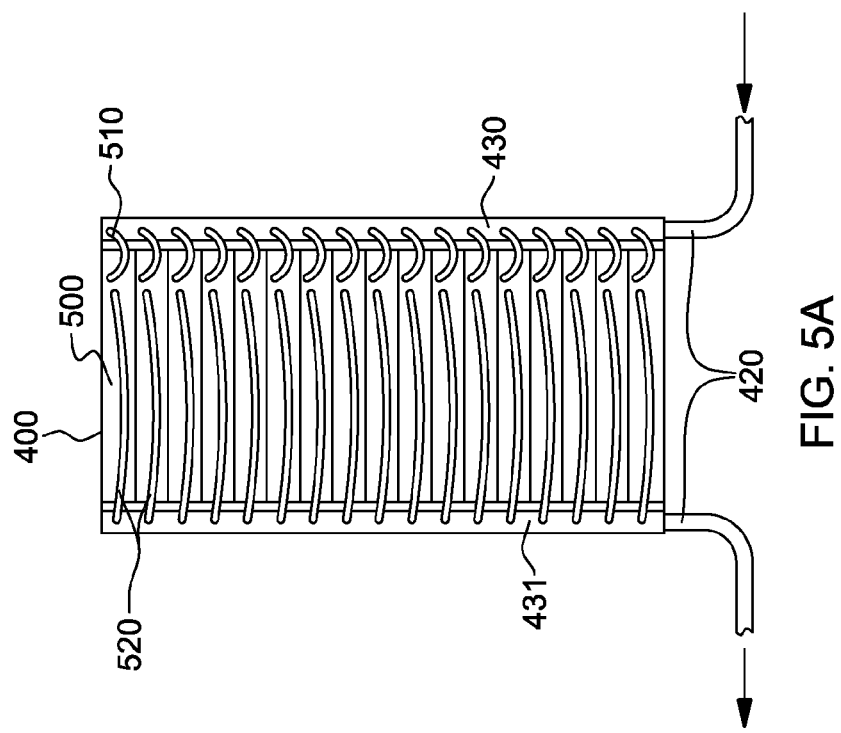
FIG. 5A is a more detailed, elevational view of one embodiment of the coolant-cooled electronics rack of FIG. 4, and illustrating rack-level coolant distribution structures, in accordance with one or more aspects of the present invention.

FIGS. 5A & 5B depict in greater detail one embodiment of a coolant-cooled electronics rack, such as depicted in FIG. 4, in accordance with one or more aspects of the present invention. In this implementation, coolant-cooled electronics rack 400 comprises a plurality of electronic systems 500, within which one or more electronic components are to be coolant-cooled via, for example, one or more cold plates or cold rails, as described below. The cooling system includes coolant loop 420 coupled in fluid communication with coolant supply manifold 430 and coolant return manifold 431, both of which may comprise vertically-oriented manifolds attached to coolant-cooled electronics rack 400. In this embodiment, the rack-level coolant distribution system further includes individual node-level supply hoses 510 supplying coolant from coolant supply manifold 430 to cold plates and cold rails within the electronic systems 500. As shown in FIG. 5B, coolant supply manifold 430 may be (in one embodiment) a vertically-oriented manifold with a plurality of coupling connections 511 disposed along the manifold, one for each electronic system 500 having one or more electronic components to be coolant-cooled. Coolant leaves the individual electronic systems 500 via node-level return hoses 520, which couple the individual electronic systems (or nodes) to coolant return manifold 431, and hence, to coolant loop 420. In the embodiment illustrated in FIG. 4, relatively warm coolant, such as water, is supplied from the cooling unit, either directly, or through one or more air-to-coolant heat exchanger(s) 415 (of FIG. 4), and hot coolant is returned via the coolant return manifold to the cooling unit. In one embodiment of the rack-level coolant distribution system illustrated in FIGS. 5A & 5B, the node-level supply and return hoses 510, 520 are flexible hoses.

Figure 6:
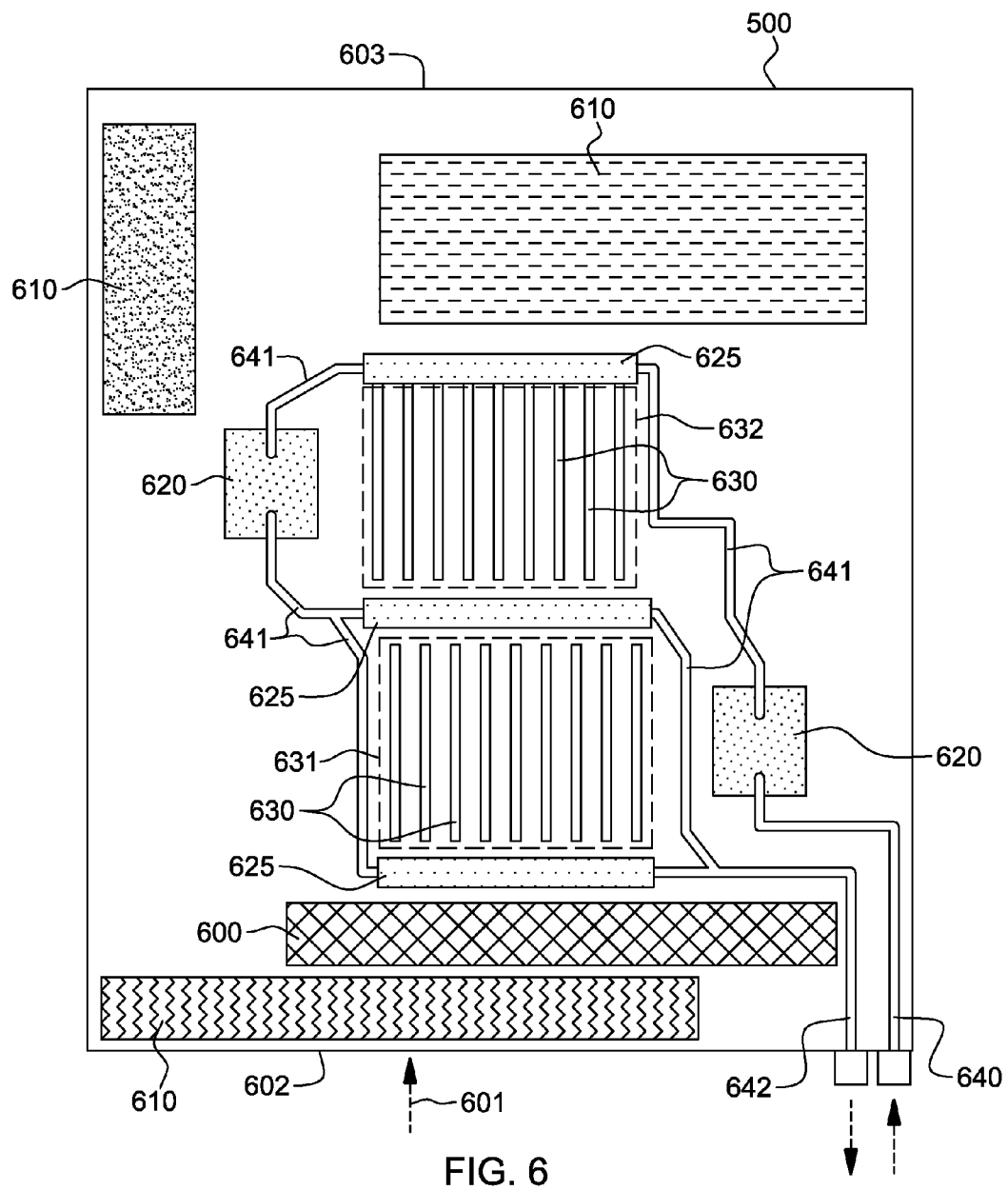
FIG. 6 is a plan view of one embodiment of an electronic system layout for a coolant-cooled electronics rack, and illustrating multiple coolant-cooled cold plates and multiple coolant-cooled cold rails coupled in fluid communication, in accordance with one or more aspects of the present invention.

FIG. 6 illustrates one embodiment of a cooled electronic system 500 component layout, wherein one or more air-moving devices 600 provide forced air flow 601 to cool multiple components 610 within electronic system 500. Cool air is taken in through a front 602 and exhausted out a back 603 of the electronic system (or drawer). The multiple components to be cooled include, for example, multiple processor modules to which coolant-cooled cold plates 620 (of the coolant-based cooling apparatus) are coupled, as well as multiple arrays 631, 632 of electronics cards 630 (e.g., memory modules such as dual in-line memory modules (DIMMs)), which are to be thermally coupled to one or more coolant-cooled cold rails 625. As used herein "thermally coupled" refers to a physical thermal transport path being established between components, for example, between an electronics card and a coolant-cooled cold rail for the conduction of heat from one to the other.

The illustrated coolant-based cooling approach further includes multiple coolant-carrying tubes connecting in fluid communication coolant-cooled cold plates 620 and coolant-cooled cold rails 625. These coolant-carrying tubes comprise (for example), a coolant supply tube 640, multiple bridge tubes 641, and a coolant return tube 642. In the embodiment illustrated, bridge tubes 641 connect one coolant-cooled cold rail 625 in series between the two coolant-cooled cold plates 620, and connect in parallel two additional coolant-cooled cold rails 625 between the second coolant-cooled cold plate 620 and the coolant return tube 642. Note that this configuration is provided by way of example only. The concepts disclosed herein may be readily adapted to use with various configurations of cooled electronic system layouts. Note also, that as depicted herein, the coolant-cooled cold rails are elongate, thermally conductive structures comprising one or more channels through which liquid coolant passes, for example, via one or more tubes extending through the structures. The coolant-cooled cold rails are disposed, in the embodiment illustrated, at the ends of the two arrays (or banks) 631, 632 of electronics cards 630, and multiple thermal spreaders are provided coupling in thermal communication electronics cards 630 and coolant-cooled cold rails 625.

By way of further enhancement, disclosed hereinbelow with reference to FIGS. 7-14 are novel control methodologies which employ, in one embodiment, weighted cooling effectiveness of selected adjustable cooling components of a cooling system cooling an electronic system. By way of example, the selected adjustable cooling components may comprise one or more adjustable pumps and/or fans with speed, and thus, applied power, to the adjustable cooling components being set via automatically determined, respective speed control settings. Further, disclosed hereinbelow are various enhancements to the basic control methodology described. Advantageously, employing the approaches disclosed herein, cooling control can react dynamically to, for instance, changes in a target temperature, such as a temperature associated with the cooling system or the electronic system being cooled. As specific examples, the target temperature could comprise a temperature of coolant being provided to the liquid-cooled electronic system, a temperature of one or more components of the electronic system, or temperature of air, for instance, exiting the electronic system, etc.

More particularly, disclosed herein below are methods of controlling cooling of an electronic system, which include automatically determining control settings, such as speed control settings, for multiple adjustable cooling components of the cooling system cooling the electronic system. The automatically determining is based, at least in part, on weighted cooling effectiveness of the multiple adjustable cooling components of the cooling system, and the automatically determining operates to limit power consumption of at least the cooling system, while ensuring a target temperature associated with at least one of the cooling system or the electronic system is within a desired range by provisioning, based at least in part on the weighted cooling effectiveness, a desired target temperature change among the multiple adjustable cooling components. The provisioning includes provisioning applied power to the multiple adjustable cooling components via, at least in part, the determined control settings. As noted, and by way of example only, the targeted temperature may be a coolant temperature, for example, at the inlet to the coolant-cooled electronic system (such as the coolant-cooled electronics rack described above).

Figure 7:
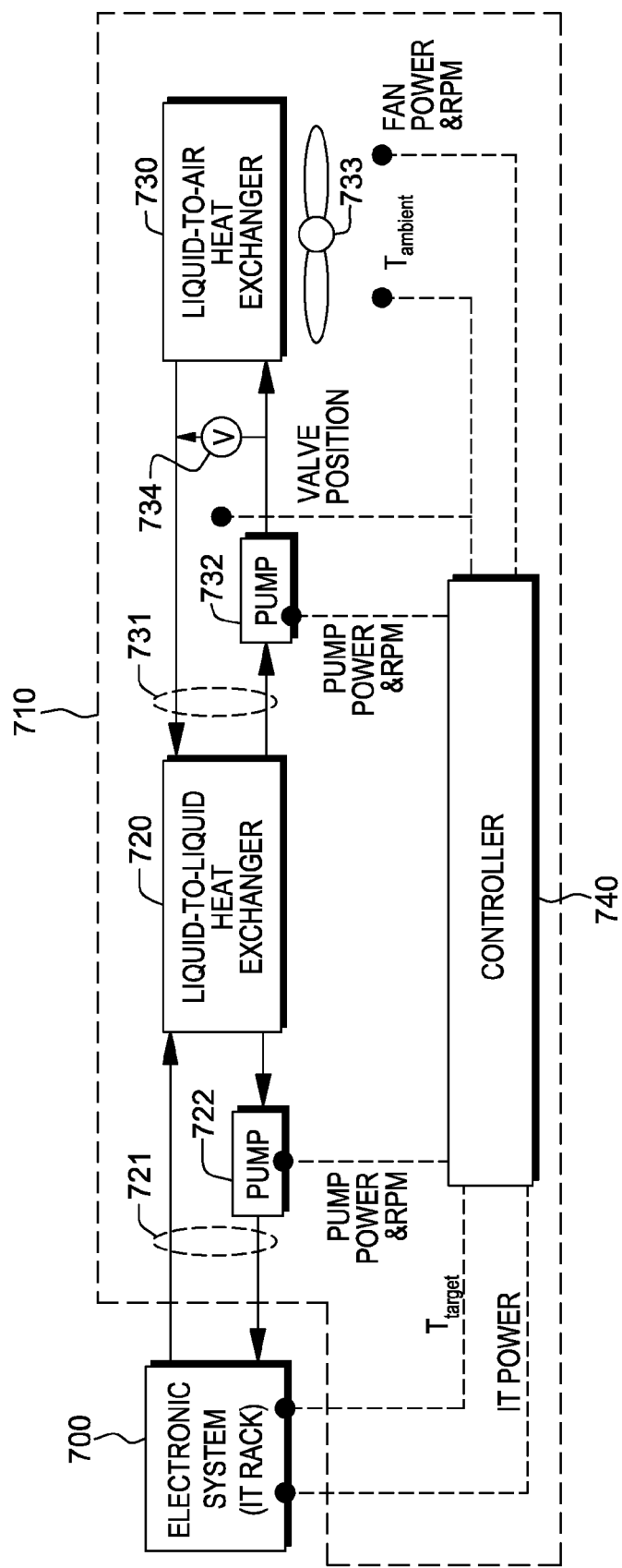
FIG. 7 is a schematic of another embodiment of a cooling system cooling one or more electronic systems of a data center, and controlled in accordance with one or more aspects of the present invention.

FIG. 7 depicts an example of a cooled electronic system comprising a controller (or control system) implementing a power consumption cooling control, in accordance with aspects of the present invention. Note that as used herein, a controller or control system may comprise, by way of example, a computer or a programmable logic controller. The control system may include, for instance, a processor (e.g., a central processing unit), a memory (e.g., main memory), and multiple input/output (I/O) connections, interfaces, devices, etc., coupled together via one or more buses and/or other connections. In one application, the controller or control system couples to a plurality of sensors, such as temperature, pressure, and position sensors, as well as to one or more actuators for controlling, for instance, coolant pump speed, fan speed, or position of one or more recirculation valves. Note that the input/output sense and control arrangements may be integrated within the controller or control system, or they may be external I/O modules or devices coupled to the controller which facilitate the desired sensing and actuation functions.

The cooled electronic system depicted in FIG. 7 includes an electronic system (or rack) 700 and a cooling system 710 providing, for example, liquid coolant via a first coolant loop 721 to electronic system (or rack) 700. Electronic system 700 may include, for example, one or more coolant-cooled structures and/or one or more air-to-coolant heat exchangers, such as described above in connection with FIGS. 2-6.

In the depicted embodiment, cooling system 710 includes a liquid-to-liquid heat exchanger 720 and a liquid-to-air heat exchanger 730. First coolant loop 721 couples in fluid communication with liquid-to-liquid heat exchanger 720, as does a second coolant loop 731, connecting liquid-to-liquid heat exchanger 720 to liquid-to-air heat exchanger 730. In this embodiment, a first coolant pump 722 pumps coolant through first coolant loop 721, and a second coolant pump 732 pumps coolant through second coolant loop 731. In addition, an air-moving device, such as a fan 733, facilitates air movement across liquid-to-air heat exchanger 730, and a recirculation valve 734 is provided, which may be a controllable valve with multiple valve settings between an open position and a closed position. A controller 740, such as a programmable logic controller or a computer, implements (in one embodiment) the control system processing described herein. Controller 740 is coupled to control, for instance, one or more of first coolant pump 722, second coolant pump 732, and fan 733, as well as recirculation valve 734. In operation, controller 740 senses or receives the power and/or speed (or revolutions per minute (RPMs)) of first coolant pump 722, second coolant pump 732, and fan 733. Controller 740 further senses a targeted or control temperature ($T_c$) associated with, for example, the electronic system or electronics rack, as well as power consumed by the electronic system (e.g., IT power).

A variety of control process embodiments may be implemented by the control system, depending for example, on the target or control temperature ($T_c$) selected, and whether cooling system power is considered alone or whether total power consumed is considered, including the cooling system power and electronic system power loads. For example, control of coolant inlet temperature ($T_c$) to an electronics rack may be desired while minimizing cooling system power ($P_c$) consumption employing multiple adjustable cooling components of the cooling system. In the example of FIGS. 8A-14, power consumption of at least the cooling system is reduced or minimized by (in one embodiment) monitoring power load of the liquid-to-liquid heat exchanger pump 722, power consumed by the second coolant pump 732, and power consumed by the fan(s) 733 of the liquid-to-air dry cooler. The pumps and fan (in this example) are examples of adjustable cooling components of the cooling system, and in particular, components where speed control settings may be adjusted, in accordance with one or more aspects of the present invention.

Generally stated, disclosed herein are methods, control systems, and computer program products for controlling cooling of an electronic system by automatically controlling a temperature in a data center associated with the cooling system or the electronic system being cooled, in an energy efficient manner. The control approach disclosed controls applied power to multiple adjustable cooling components of the cooling system in a manner such that total cooling demand is provisioned among the multiple adjustable cooling components employing cooling-effectiveness-based weighting factors for the cooling components.

For instance, and as noted, a method of controlling cooling of an electronic system is disclosed herein which includes: automatically determining control settings for multiple adjustable cooling components of a cooling system cooling the electronic system, the automatically determining being based, at least in part, on weighted cooling effectiveness of the multiple adjustable cooling components of the cooling system; and wherein the automatically determining operates to limit power consumption of at least the cooling system, while ensuring that a target temperature associated with at least one of the cooling system or the electronic system is within a desired range by provisioning, based at least in part on the weighted cooling effectiveness, a desired target temperature among the multiple adjustable cooling components. The provisioning includes provisioning applied power to the multiple adjustable cooling components via, at least in part, the determined control settings.

Numerous enhancements to the basic control process outlined above are also disclosed herein. For instance, the applied change may be a change in cooling component speed determined from the required (i.e., desired) target temperature change, the cooling-effectiveness-based weighting factor of each cooling component to be adjusted, and one or more additional gain terms. The weighting factor for cooling component n of the cooling system may be determined as a fraction of the cooling effectiveness of that piece of cooling equipment to the total system cooling effectiveness. For example, cooling effectiveness of cooling component n may be determined as the ratio of the change in target (or control) temperature ($T_c$) over a range of cooling component speeds to the change in cooling component power consumption over the same range of cooling component speeds, and where the total system cooling effectiveness may be determined as the sum of cooling effectivenesses of the multiple cooling components in the system.

In one embodiment, single cooling effectiveness-based weighting and speed control factors are determined for each selected, adjustable cooling component of the cooling system to be automatically controlled, and are applied over the entire range of the cooling component's speed. In another embodiment, multiple cooling effectiveness-based weighting and speed control factors are determined for each selected, adjustable cooling component of the cooling system to be automatically controlled, with individual factors being determined and applied within respective sub-ranges of the entire range of the cooling equipment's speed. In a further embodiment, the weighting and speed control factors may be dynamically determined at runtime of the cooling and control systems and applied to each selected cooling component continuously over the range of the cooling component's speeds. Further enhancements include ascertaining the weighted cooling effectiveness for each selected cooling component n, based on the change in the total power change for cooling component n, and for the electronic system, as cooling component speed changes. In a further enhancement, one or more additional gain terms for the adjustable cooling components of the cooling system may be adjusted, based on the respective component's associated time constant, and still further, the additional gain terms used in the automatic determination of the new cooling component speeds may be, in one implementation, integral and/or differential gain terms, as explained below.

To facilitate the following further explanation, the below-listed variables of Table 1 are defined.

TABLE 1

| Variable | Description |
| --- | --- |
| n | Cooling component number. |
| N | Total number of selected, speed-controllable cooling components (for instance, in the example of FIG. 7, the total number is three: two pumps, and one fan). |
| $RPM_n$ | Speed of cooling component n. |

TABLE 1-continued

| Variable | Description |
|---|---|
| $\theta_n$ | Difference between target or control temperature $T_c$ and ambient temperature $T_a$ at $RPM_n$. |
| $Q_n$ | Cooling component n power consumption at $RPM_n$. |
| $F_n, f_n$ | Ratio of change of achievable target temperatures ($T_c$) to change of power consumption of cooling component n. This is an indication of cooling component n cooling effectiveness. |
| $F_t, f_t$ | Total cooling effectiveness for all N cooling components. |
| $X_n, \phi_n$ | Ratio of cooling effectiveness of cooling component n to total cooling effectiveness ($F_t, f_t$) of all adjustable cooling components being automatically controlled. This is the cooling effectiveness weighting factor. |
| $S_n, \sigma_n$ | Ratio of change of achievable control temperature to change of RPM of cooling component. This is the speed control factor. |
| $\Delta RPM_{c,n}$ | Change in RPM desired to current RPM for cooling component n. Can be either positive (an increase in component RPM) or negative (a reduction in component RPM). |
| $P_s$ | Power scaling factor = actual IT power/characterized IT power = $Q_{IT}/Q_{char}$, where $Q_{char}$ is the IT power at which the temperature and power relationships are determined. |
| $G_n$ | Proportional gain for cooling component n. |
| $I_n$ | Integral control gain for cooling component n. |
| $D_n$ | Differential control gain for cooling component n. |
| $T_c$ | Target or control temperature in data center (e.g., coolant temperature entering servers/rack). |
| $T_{c,spec}$ | Required/desired control temperature in data center. |
| $T_{c,min}, T_{c,max}$ | Minimum and maximum allowable target or control temperatures. |
| $\Delta T_{c,t}$ | Required target temperature delta at time t. |
| $\Delta T_{c,t-1}$ | Required control temperature delta at previous time step t − 1. |
| $\tau_n$ | Time constant associated with changes in cooling component n. |

Three principle approaches to determining weighted cooling effectiveness of a cooling component are disclosed. These approaches are referred to herein as the single range approach, the piecewise approach, and the differential approach. In the single range approach, a single cooling effectiveness-based weighting and speed control factors are predetermined for each cooling component of the cooling system, and applied over the entire range of the cooling component's speed. In the piecewise approach, multiple weighting and speed control factors are determined for a cooling component, with individual weighting and speed control factors being determined and applied within a respective sub-range or piece of an entire range of cooling component speed. In a differential approach, weighting and speed control factors are dynamically determined at runtime and applied to the cooling component continuously over the range of that equipment's speed.

Figure 8A:
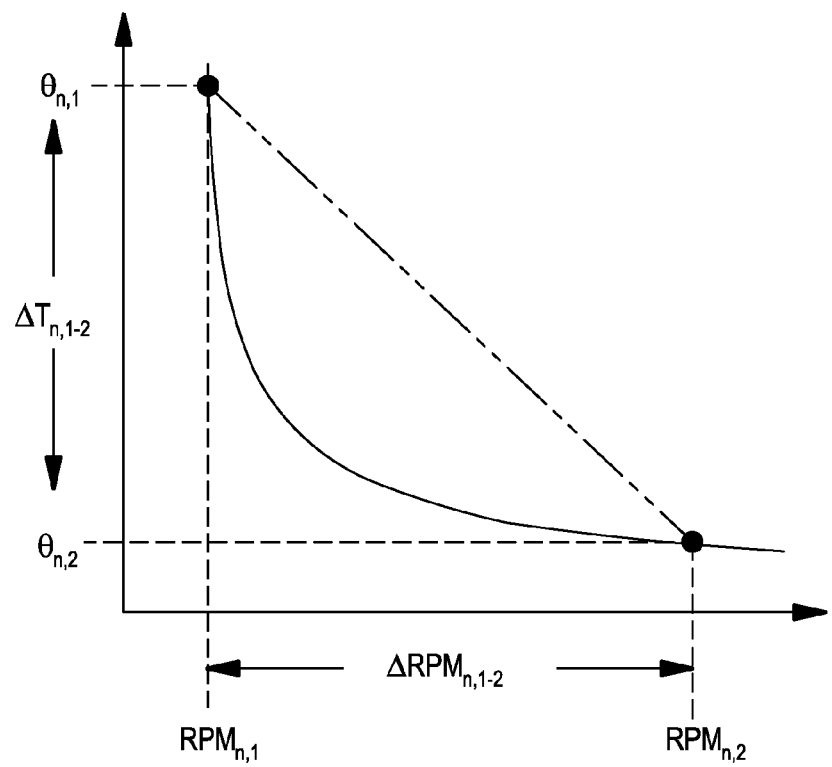
FIG. 8A is a graph of an experimentally characterized relationship between a change in a temperature differential ($\theta_n$) for changes in speed (RPMs) of a cooling component n between specified minimum and maximum settings, in accordance with one or more aspects of the present invention.
Figure 8B:
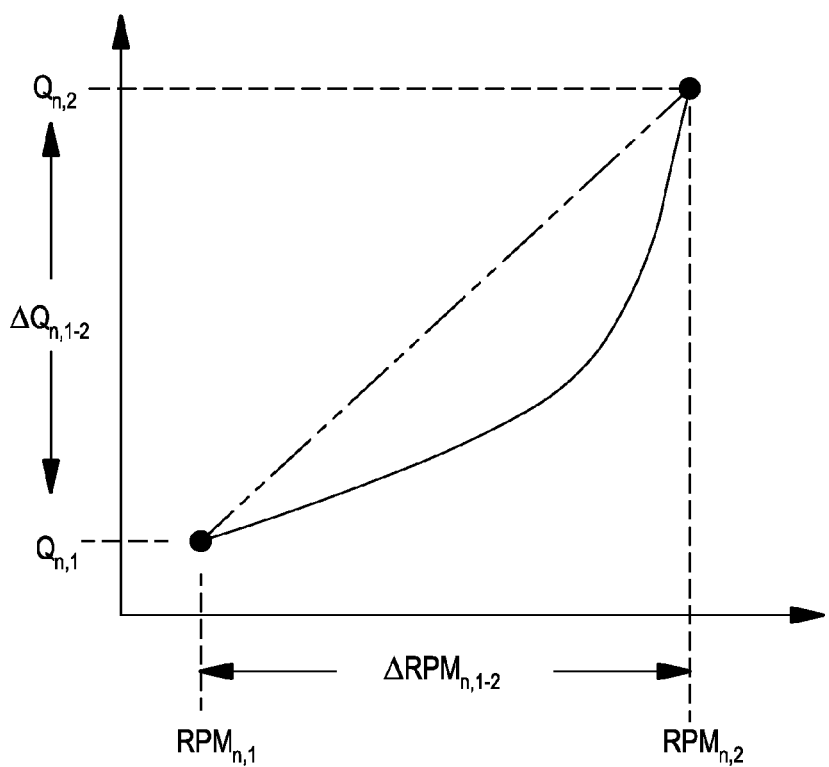
FIG. 8B is a graph of an experimentally characterized total cooling power ($Q_n$) change as speed (RPM) of cooling component n changes between the specified minimum and maximum settings, in accordance with one or more aspects of the present invention.

FIGS. 8A & 8B depict experimentally characterized relationships in a single range example. In FIG. 8A, the difference between the target or control temperature ($T_c$) and ambient temperature ($T_a$) for changes in speed (RPMs) for a cooling component n of the cooling system to be automatically controlled is experimentally characterized. The single range approach illustrates a straight line approximation between a specified minimum cooling component speed ($RMP_{n,1}$) and a maximum coolant component n speed ($RPM_{n,2}$). Note that these minimum and maximum settings do not have to be the actual minimum and maximum RPMs attainable by cooling component n. In FIG. 8B, cooling component n cooling power changes ($\Delta Q_n$) are characterized as RPMs change between the specified minimum and maximum settings of the cooling component, which as noted, may be other than the component's actual minimum and maximum speeds.

Figure 9A:
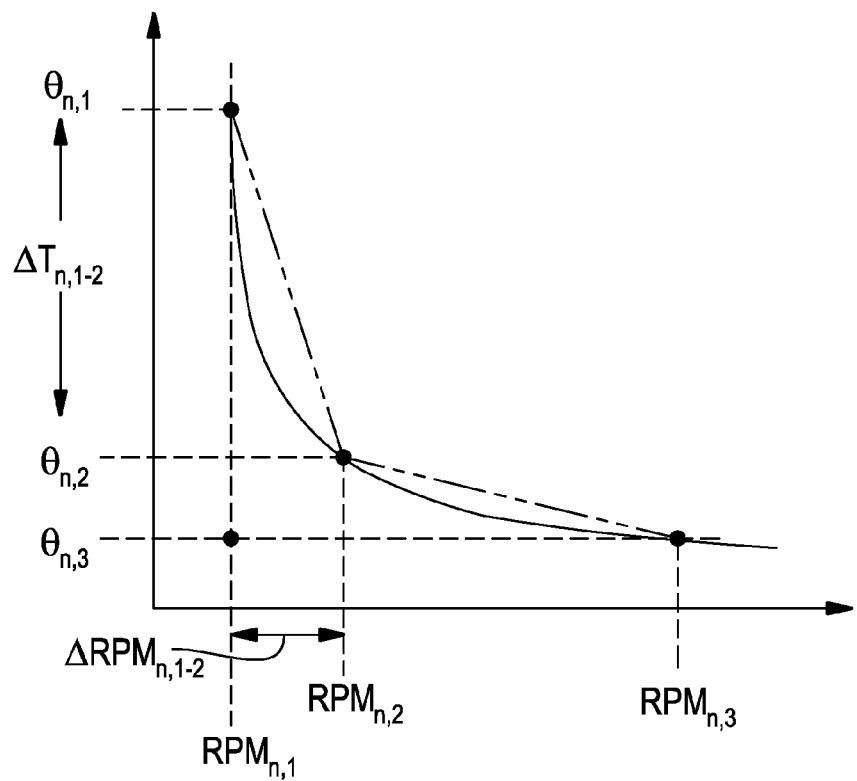
FIG. 9A depicts an experimentally characterized piecewise relationship between a change in the temperature differential ($\theta_n$) for changes in cooling component speed (RPM) of cooling component n between specified minimum and maximum settings, in accordance with one or more aspects of the present invention.
Figure 9B:
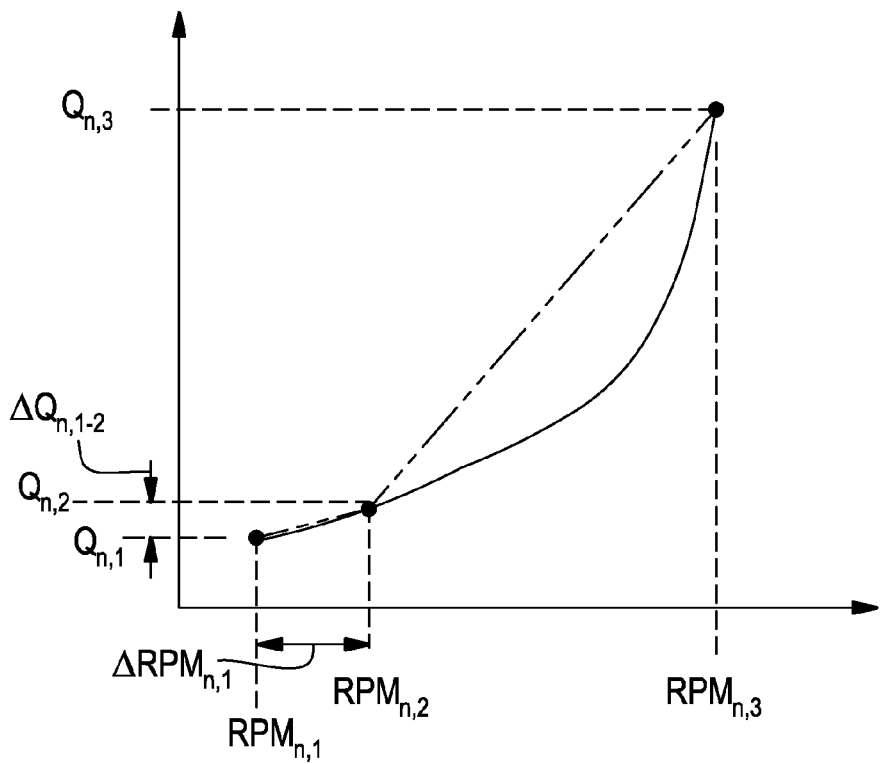
FIG. 9B is a graph of an experimentally characterized piecewise relationship between total cooling power ($Q_n$) change as speed (RPMs) of cooling component n changes

FIGS. 9A & 9B depict similar experimentally characterized relationships using the piecewise range approach. As shown in the approach of FIG. 9A, piecewise linear determinations of the differences ($\theta_n$) between the target or control temperature ($T_c$) and the ambient temperature ($T_a$) as speed of cooling component n changes between specified minimum ($RPM_{n,1}$), to an intermediate speed setting ($RPM_{n,2}$), and then to a maximum setting ($RPM_{n,3}$) are obtained. As noted, the minimum and maximum RPM settings for cooling component n do not need to be actual minimum and maximum RPM settings for the component. In FIG. 9B, cooling component power changes ($\Delta Q_n$) are ascertained for different pieces (or ranges) of the change in speed from, for instance, a minimum ($RPM_{n,1}$) to an intermediate speed ($RPM_{n,2}$), and from the intermediate speed ($RPM_{n,2}$) to the maximum speed ($RPM_{n,3}$).

Further, the experimentally characterized relationships may be used to determine certain control parameters. For instance, the following equations (1)-(3) may be employed to predetermine the identified parameters for each selected cooling component n of the cooling system to be automatically controlled, where i and j denote different component speeds in the evaluation process:

$$\Delta T_n = \theta_{n,i} - \theta_{n,j}, \quad (1)$$

$$\Delta Q_n = Q_{n,j} - Q_{n,i}, \text{and} \quad (2)$$

$$\Delta RPM_n = RPM_{n,j} - RPM_{n,i}. \quad (3)$$

Using the results obtained from equations (1)-(3), the following equations (4)-(7) can then be employed and predetermined for each selected cooling component n of the cooling system (for a single range approach), or could be calculated during run time, or chosen from a table for the piecewise approach, to further characterize the cooling component:

$$S_n = \frac{\Delta T_n}{\Delta RPM_n}, \quad (4)$$

$$F_n = \frac{\Delta T_n}{\Delta Q_n}, \quad (5)$$

-continued $$F_t = \sum_{1}^{N} F_n, \quad (6)$$

and $$X_n = \frac{F_n}{F_t}. \quad (7)$$

As noted above, the ratio ($S_n$) of achievable control temperature ($T_c$) to range of RPMs of cooling component n may be predetermined for both the single range and piecewise approach, as well as the proportional gain ($G_n$) for cooling component n, and optionally, the integral control gain ($I_n$), and differential control gain ($D_n$) for cooling component n. The ratio ($X_n$) can be predetermined for the single range approach and calculated for the other approaches. These predetermined variables may be assembled in a look-up table, such as depicted in FIG. 10A.

FIG. 10B depicts an example of a look-up table for a piecewise control approach, where there are n cooling components of the cooling system, with M ranges (or pieces) to the changes in speed of each adjustable cooling component. Note that each coolant component can have a different number of sub-ranges or pieces in the example of FIG. 10B. In this example, the ratio ($F_n$) of the range of achievable target temperature ($T_c$) to range of power consumption of cooling component n is predetermined, but the ratio ($X_n$) needs to be calculated at runtime.

In addition, a desired or required control temperature change ($\Delta T_{c,t}$) may be ascertained at time t using equation (8):

$$\Delta T_{c,t} = (T_c - T_{c,spec}). \quad (8)$$

This required target temperature change ($\Delta T_{c,t}$) may then be converted to speed control changes ($\Delta RPM_{c,n}$) for the respective adjustable cooling components n of the cooling system at each control time step (e.g., see the process flow of FIGS. 13A & 13B, described below) employing, for instance, equation (9):

$$\Delta RPM_{c,n} = P_s \times X_n \times G_n \times \left(\frac{\Delta T_{c,t}}{S_n}\right). \quad (9)$$

Using the above equations, and the cooling example of FIG. 7, with only two adjustable cooling components selected for automated control, that is, the adjustable fan and the adjustable pump in the secondary loop (i.e., second coolant pump 732 in second coolant loop 731), and by way of example only, the following example set of determinations for a linearized, single range approach such as disclosed herein, may be ascertained:

Changes in ΔT and power and RPMs with a characterized electronic system power of 13 kW:

$$\Delta T_{fan} = \theta_{fan,max} - \theta_{fan,min} = 8.5° \text{ C}.$$

$$\Delta T_{pump} = \theta_{pump,max} - \theta_{pump,min} = 6.5° \text{ C}.$$

$$\Delta Q_{fan} = Q_{fan,max} - Q_{fan,min} = 5460 \text{ W}$$

$$\Delta Q_{pump} = Q_{pump,max} - Q_{pump,min} = 710 \text{ W}$$

$$\Delta RPM_{fan} = RPM_{fan,max} - RPM_{fan,min} = 1330$$

$$\Delta RPM_{pump} = RPM_{pump,max} - RPM_{pump,min} = 2550$$

Rate of changes in ΔT with power:

$$F_{fan} = \Delta T_{fan}/\Delta Q_{fan} = 0.0015° \text{ C./W}$$

$$F_{pump} = \Delta T_{pump}/\Delta Q_{pump} = 0.0092° \text{ C./W}$$

Rate of changes in ΔT with RPM:

$$S_{fan} = \Delta T_{fan}/\Delta RPM_{fan} = 0.0064° \text{ C./RPM}$$

$$S_{pump} = \Delta T_{pump}/\Delta RPM_{pump} = 0.0025° \text{ C./RPM}$$

Weighting factors X for the rate of changes in ΔT with power:

$$F_t = F_{fan} + F_{pump} = 0.0107° \text{ C./W}$$

$$X_{fan} = F_{fan}/F_t = 0.14$$

$$X_{pump} = F_{pump}/F_t = 0.86$$

When cooling system is running, only the following calculations are needed with the $T_{c,t}$ and $P_s$ variables over time, due to changing ambient conditions and IT (i.e., electronic system) workloads.

Assuming a $\Delta T_{c,t}$ of +1° C., $G_{fan} = G_{pump} = 1$, and an electronic system power load of 10 kW (thus $P_s = 10/13 = 0.77$), the applied RPM change ($\Delta RPM_{c,n}$) of each piece of cooling equipment at time t would be:

$$\Delta RPM_{c,fan} = (P_s \times X_{fan} \times G_{fan}/S_{fan}) \times (T_{c,t}) = 17 \text{ RPM}$$

$$\Delta RPM_{c,pump} = (P_s \times X_{pump} \times G_{pump}/S_{pump}) \times (T_{c,t}) = 263 \text{ RPM}$$

Again, the above-noted, specific example is provided by way of explanation, and not limitation.

As noted, another automated control approach disclosed herein is to determine weighting and cooling effectiveness for each selected, automated cooling component n of the cooling system continuously, over a range of cooling component speeds, using a differential approach. This differential approach may provide a more accurate result, and thus, optimal energy use, with all determinations or calculations being carried out at run time, based on the current state of the adjustable cooling components of the cooling system, and the current state of the electronic system. The differential approach could employ, in one embodiment, equations (10)-(16), set out below:

$$\theta_n = a + b \times (RPM_n)^c, \quad (10)$$

$$Q_n = d \times (RPM_n) + e \times (RPN_n)^2 + g(RPM_n)^3, \quad (11)$$

$$\sigma_n = \left(-\frac{d\theta_n}{d(RPM_n)}\right), \quad (12)$$

$$f_n = \left(-\frac{d\theta_n}{d(RPM_n)}\right) / \left(\frac{dQ_n}{d(RPM_n)}\right), \quad (13)$$

$$f_t = \sum_{1}^{N} f_n, \quad (14)$$

$$\varphi_n = \frac{f_n}{f_t}, \quad (15)$$

and $$\Delta RPM_{c,n} = P_s \times \varphi_n \times G_n \times \frac{\Delta T_{c,t}}{\sigma_n}. \quad (16)$$

Figure 11A:
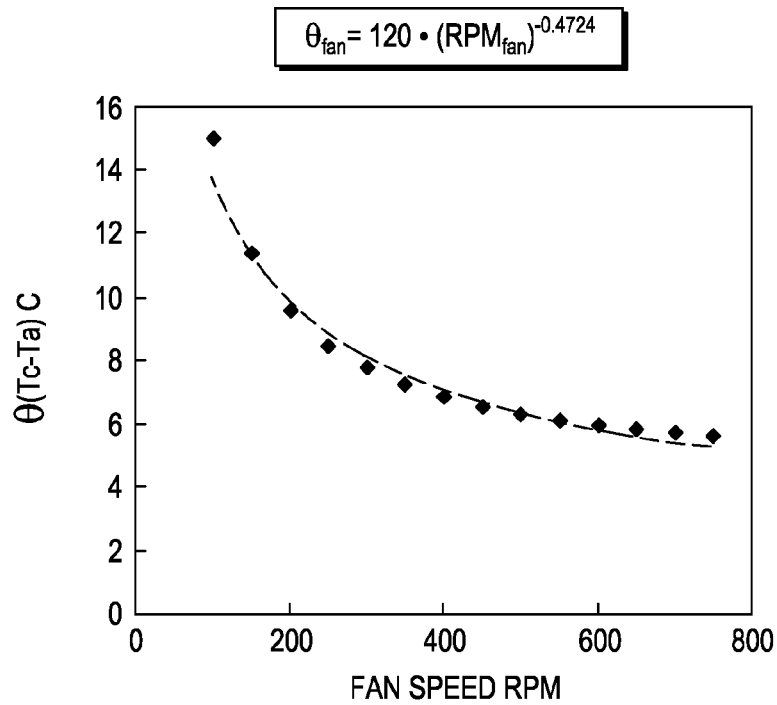
FIG. 11A is an example graph of temperature differential ($\theta_n$) change with speed (RPMs) changes of a fan component of a cooling system, in accordance with one or more aspects of the present invention.
Figure 11B:
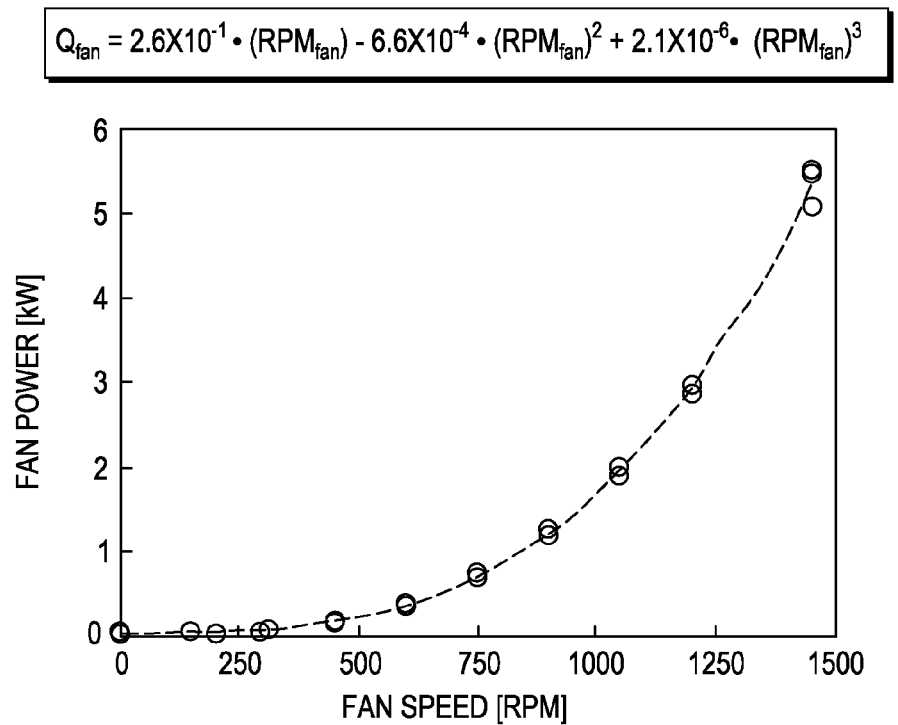
FIG. 11B is an example graph of power consumption ($Q_n$) versus fan speed (RPMs) settings for the fan component of the cooling system, in accordance with one or more aspects of the present invention.

Where:
  a-e are constants which depend on the characterization of the system, which may be obtained by modeling, or experimentally. For instance, FIGS. 11A & 11B depict examples of the functional form for difference ($\theta_{fan}$) and the cooling component power consumption ($Q_{fan}$), respectively, for a fan component of the cooling system.

In FIG. 12, one embodiment of a look-up table for a differential control approach is presented, wherein only the proportional gain for cooling component n, and optionally, the integral control gain for cooling component n, and differential control gain for cooling component n, are provided ahead, with the remaining characteristics being dynamically determined using, for instance, equations (10)-(16) above.

Figure 13A:
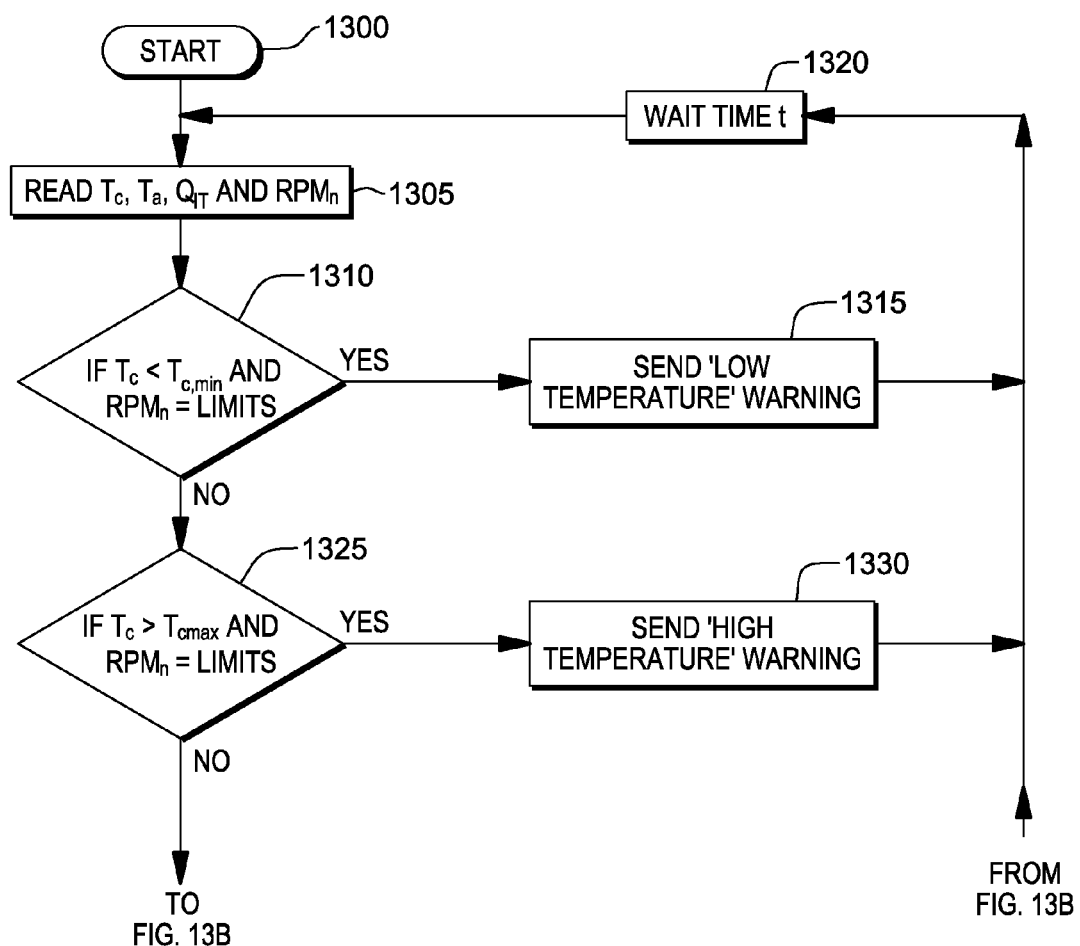
FIGS. 13A & 13B depict one embodiment of a process for controlling cooling of an electronic system by automatically determining speed control settings for multiple adjustable cooling components of the cooling system, in accordance with one or more aspects of present invention.
Figure 13B:
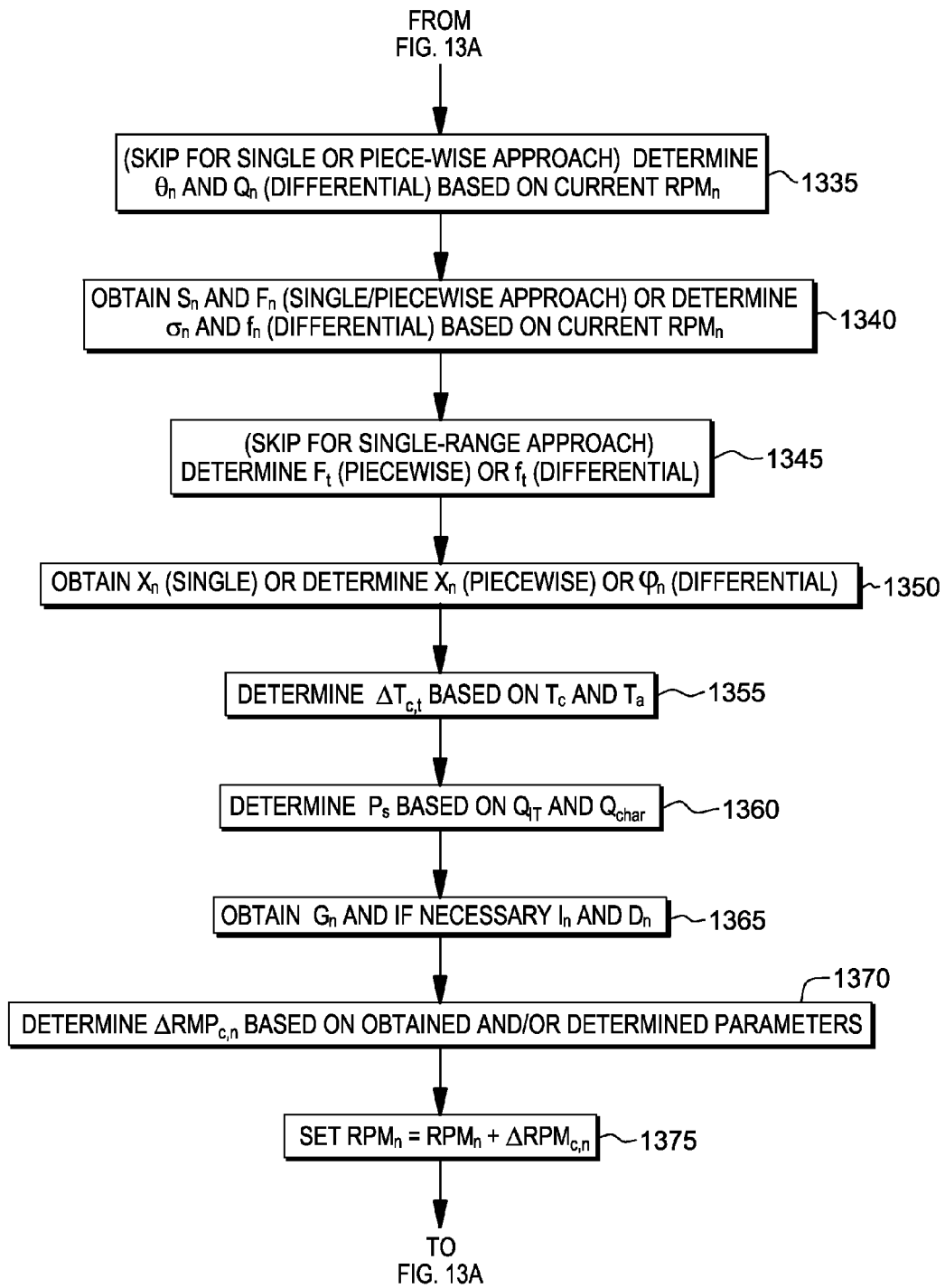

FIGS. 13A & 13B depict one embodiment of a process for controlling cooling of an electronic system, in accordance with various aspects of the present invention. As noted, in each of the embodiments disclosed herein, the controller or control system automatically controls a target or control temperature in a data center, for instance, associated with the cooling system or the electronic system being cooled by the cooling system, in an energy efficient manner, by automatically adjusting control settings applied to, for instance, multiple adjustable cooling components of the cooling system. In implementation, the total cooling demand is provisioned among the multiple cooling components of the cooling system using cooling-effectiveness-based weighting factors for the components.

Referring to the process of FIGS. 13A & 13B, processing begins 1300 with reading a target or control temperature ($T_c$), ambient air temperature ($T_a$), electronic system power load ($Q_{IT}$), and applied power (e.g., $RPM_n$), for each selected, adjustable cooling component n of the cooling system 1305. Processing determines whether the target temperature ($T_c$) is less than the specified minimum target temperature ($T_{c,min}$), and the RPMs of the adjustable cooling components of the cooling system are at respective limits 1310. If "yes", then a "low temperature" warning is issued 1315, after which processing waits a time interval t 1320 before again reading the current target temperature ($T_c$), ambient air temperature ($T_a$), electronic system power load ($Q_{IT}$), and speed (RPM) of each adjustable cooling component 1305. Assuming that the target temperature ($T_c$) is at or greater than the minimum specified target temperature ($T_{c,min}$), or the speed ($RPM_n$) of one or more adjustable cooling component n of the cooling system is other than at its limit, processing determines whether the target temperature ($T_c$) is above a specified maximum target temperature ($T_{c,max}$), and speed (RPMs) of the adjustable cooling components of the cooling system are at respective limits 1325, meaning that no further adjustments can be made to bring down the target temperature. In this case, processing sends a "high temperature" warning 1330, before waiting time interval t 1320, and repeating the read operation 1305.

As shown in FIG. 13B, assuming that the target temperature is within the specified range and/or speed of one or more cooling components of the cooling system may be adjusted to bring the target temperature back within its specified range, then processing proceeds to ascertain certain parameters employed in the weighted cooling effectiveness control approach described.

As shown, processing ascertains the difference ($\theta_n$) parameter and cooling component n power consumption ($Q_n$) based on current RPMs of cooling component n 1335. If a single range or piecewise range approach is being used, then the corresponding values have been predetermined, and processing obtains the ratio ($S_n$) of the range of achievable control temperatures to the range of RPMs of cooling component n, and the ratio ($F_n$) of the range of achievable target temperatures ($T_c$) to the range of power consumption of cooling component n values 1340. If a differential approach is being employed, then ($\theta_n$), ($Q_n$), ($\sigma_n$) and ($f_n$) are calculated based on current speed ($RPM_n$) of cooling component n.

Next, for a piecewise control approach, the total cooling effectiveness for all n cooling components is ascertained ($F_t$), or for a differential approach, the total ($f_t$) is dynamically ascertained using, for instance, equations (13) & (14), noted above 1345.

Processing also obtains a weighting ratio ($X_n$) of the cooling effectiveness of cooling component n to the total cooling effectiveness ($F_t$) of the adjustable cooling components of the cooling system (in a single range approach), or calculates the ratio ($X_n$) for a piecewise approach, or determines the ratio ($\phi_n$) for a differential approach (see equations (13)-(15) above) 1350.

The desired or required target temperature change ($\Delta T_{c,t}$) is determined based on the current target temperature ($T_c$), and the current ambient temperature ($T_a$) 1355, and processing determines a current power scaling factor ($P_s$), based on the current electronic system power load ($Q_{IT}$), divided by the characterized electronic system power load ($Q_{char}$) 1360. In addition, processing looks up the predetermined proportional gain ($G_n$) for each cooling component n, and if necessary, the integral gain control ($I_n$) and differential control gain ($D_n$) 1365. From this information, the change in RPMs desired from the current RPM setting for cooling component n is determined ($\Delta RPM_{c,n}$) 1370 based on the obtained and/or calculated parameters, and using (for instance) equation (9) for the single range and piecewise approaches, or equation (16) for the differential approach. In this manner, weighted cooling effectiveness is employed in distributing the speed setting changes, and thus, the changes in applied power to the adjustable cooling components of the cooling system 1375. Note that the change in RPM ($\Delta RPM_{c,n}$) may be either positive or negative, based on the desired temperature change ($\Delta T_{c,t}$) at the current time. Processing subsequently returns to wait time interval t 1320, before repeating the control process at the next control increment.

As will be appreciated by one skilled in the art, one or more control aspects of the present invention may be embodied as a system, method or computer program product. Accordingly, one or more control aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system". Furthermore, one or more control aspects of the present invention may take the form of a computer program product embodied in one or more computer readable medium(s) having computer readable program code embodied thereon.

Any combination of one or more computer readable medium(s) may be utilized. The computer readable medium may be a computer readable storage medium. A computer readable storage medium may be, for example, but not limited to, an electronic, magnetic, optical, electromagnetic, infrared or semiconductor system, apparatus, or device, or any suitable combination of the foregoing. More specific examples (a non-exhaustive list) of the computer readable storage medium include the following: a portable computer diskette, a hard disk, a random access memory (RAM), a read-only memory (ROM), an erasable programmable read-only memory (EPROM or Flash memory), a portable compact disc read-only memory (CD-ROM), an optical storage device, a magnetic storage device, or any suitable combination of the foregoing. In the context of this document, a computer readable storage medium may be any tangible medium that can contain or store a program for use by or in connection with an instruction execution system, apparatus, or device.

Figure 14:
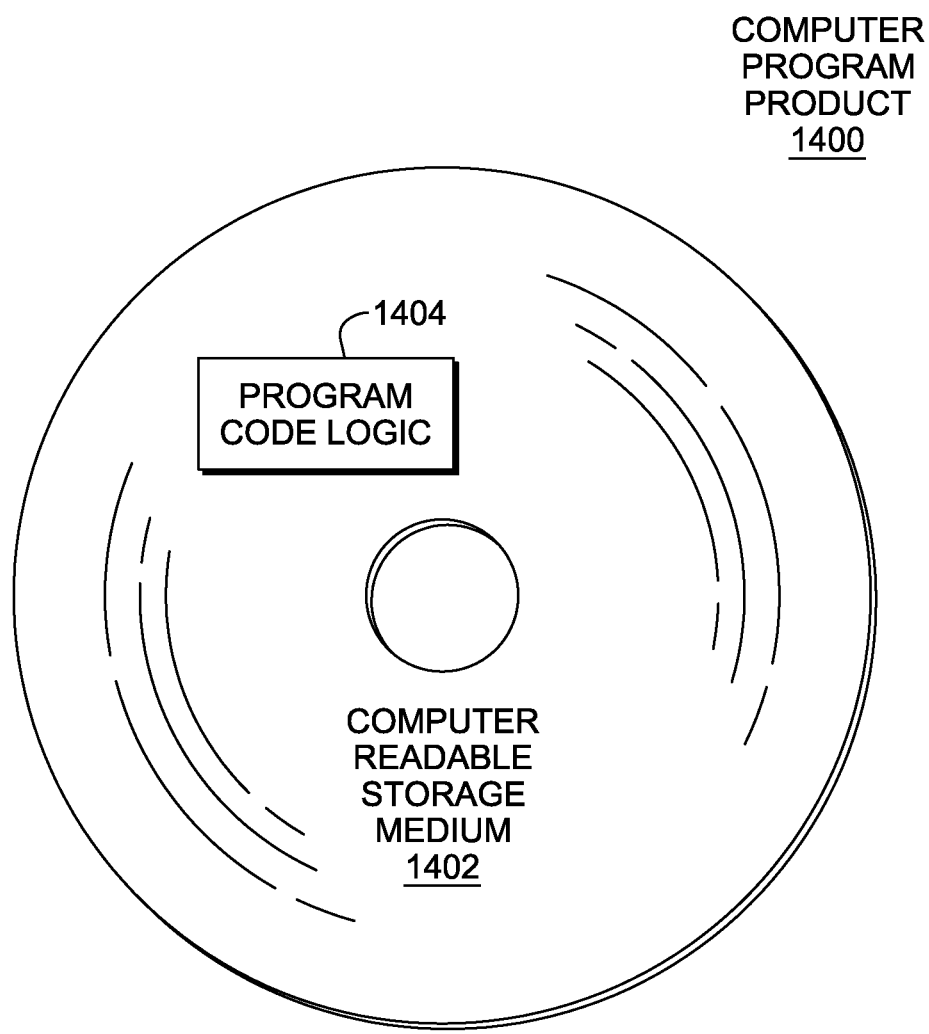
FIG. 14 depicts one embodiment of a computer program product incorporating one or more aspects of the present invention.

Referring now to FIG. 14, in one example, a computer program product 1400 includes, for instance, one or more non-transitory computer readable storage media 1402 to store computer readable program code means or logic 1404 thereon to provide and facilitate one or more aspects of the present invention.

Program code embodied on a computer readable medium may be transmitted using an appropriate medium, including but not limited to, wireless, wireline, optical fiber cable, RF, etc., or any suitable combination of the foregoing.

Computer program code for carrying out operations for one or more control aspects of the present invention may be written in any combination of one or more programming languages, including an object oriented programming language, such as Java, Smalltalk, C++ or the like, and conventional procedural programming languages, such as the "C" programming language, assembler or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

One or more aspects of the present invention are described herein with reference to flowchart illustrations and/or block diagrams of methods, apparatus (systems) and computer program products according to embodiments of the invention. It will be understood that each block of the control flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the figures illustrate the architecture, functionality, and operation of possible implementations of systems, methods and computer program products according to various embodiments of one or more aspects of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

In addition to the above, one or more aspects of the present invention may be provided, offered, deployed, managed, serviced, etc. by a service provider who offers management of customer environments. For instance, the service provider can create, maintain, support, etc. computer code and/or a computer infrastructure that performs one or more aspects of the present invention for one or more customers. In return, the service provider may receive payment from the customer under a subscription and/or fee agreement, as examples. Additionally or alternatively, the service provider may receive payment from the sale of advertising content to one or more third parties.

In one aspect of the present invention, an application may be deployed for performing one or more aspects of the present invention. As one example, the deploying of an application comprises providing computer infrastructure operable to perform one or more aspects of the present invention.

As a further aspect of the present invention, a computing infrastructure may be deployed comprising integrating computer readable code into a computing system, in which the code in combination with the computing system is capable of performing one or more aspects of the present invention.

As yet a further aspect of the present invention, a process for integrating computing infrastructure comprising integrating computer readable code into a computer system may be provided. The computer system comprises a computer readable medium, in which the computer medium comprises one or more aspects of the present invention. The code in combination with the computer system is capable of performing one or more aspects of the present invention.

Although various embodiments are described above, these are only examples. Further, other types of computing environments can benefit from one or more aspects of the present invention.

As a further example, a data processing system suitable for storing and/or executing program code is usable that includes at least one processor coupled directly or indirectly to memory elements through a system bus. The memory elements include, for instance, local memory employed during actual execution of the program code, bulk storage, and cache memory which provide temporary storage of at least some program code in order to reduce the number of times code must be retrieved from bulk storage during execution.

Input/Output or I/O devices (including, but not limited to, keyboards, displays, pointing devices, DASD, tape, CDs, DVDs, thumb drives and other memory media, etc.) can be coupled to the system either directly or through intervening I/O controllers. Network adapters may also be coupled to the system to enable the data processing system to become coupled to other data processing systems or remote printers or storage devices through intervening private or public networks. Modems, cable modems, and Ethernet cards are just a few of the available types of network adapters.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of one or more aspects of the invention and the practical application, and to enable others of ordinary skill in the art to understand one or more aspects of the invention for various embodiments with various modifications as are suited to the particular use contemplated.

What is claimed is:

1. A method of controlling cooling of an electronic system, the method comprising:
   automatically determining control settings for multiple adjustable cooling components of a cooling system cooling the electronic system, the automatically determining control settings being based, at least in part, on weighted cooling effectiveness of the multiple adjustable cooling components of the cooling system, the automatically determining control settings providing determined control settings;
   wherein the automatically determining control settings operates to limit power consumption of at least the cooling system, while ensuring that a target temperature associated with at least one of the cooling system or the electronic system is within a desired range by provisioning, based at least in part, on the weighted cooling effectiveness, a desired target temperature change among the multiple adjustable cooling components, the provisioning including provisioning applied power to the multiple adjustable cooling components via, at least in part, the determined control settings;
   wherein the automatically determining control settings comprises automatically determining speed control settings for the multiple adjustable cooling components of the cooling system to provide determined speed settings, each adjustable cooling component n of the multiple adjustable cooling components comprising an adjustable speed control, and wherein the provisioning includes provisioning the applied power to the multiple different cooling components via, at least in part, the determined speed settings;
   wherein the automatically determining control settings further comprises ascertaining the desired target temperature change for a particular time to facilitate maintaining the target temperature within the desired range, and obtaining a weighting ratio of cooling effectiveness of adjustable cooling component n to a total cooling effectiveness of the multiple adjustable cooling components, and a proportional gain for adjustable cooling component n of the multiple adjustable cooling components and, based at least in part thereon, determining the speed control settings for the multiple adjustable cooling components of the cooling system to achieve the desired target temperature change; and
   wherein determining the speed control setting for adjustable cooling component n of the multiple. adjustable cooling components comprises determining a change in speed control setting for adjustable cooling component n, the change in speed control setting for adjustable cooling component being determined as:

$$\Delta RPM_{c,n} = P_s \times X_n \times G_n \times \left(\frac{\Delta T_{c,t}}{S_n}\right)$$

where:
   $\Delta RPM_{c,n}$ = determined change in speed control setting for adjustable cooling n;
   $P_s$ = power scaling factor;
   $X_n$ = weighting ratio of cooling effectiveness of cooling component n to total cooling effectiveness of the multiple adjustable cooling components;
   $G_n$ = proportional gain for cooling component n;
   $\Delta T_{c,t}$ = required total target temperature change; and
   $S_n$ = ratio of range of achievable target temperature change to RPM range of cooling component n.

2. The method of claim 1, wherein cooling effectiveness of a cooling component n of the multiple adjustable cooling components comprises a ratio of a range of achievable target temperature changes to a range of power consumption of the cooling component n.

3. The method of claim 1, wherein the ascertaining the desired target temperature change is dynamically determined, and wherein the obtaining the weighting ratio for cooling component n of the multiple adjustable cooling components comprises predetermining the weighting ratio by employing a single range approximation between a set minimum speed control setting and a set maximum speed control setting, or multiple sub-range approximations between the set minimum speed control setting and the set maximum speed control setting.

4. The method of claim 1, wherein the ascertaining the desired target temperature change is dynamically determined, and wherein the obtaining the weighting ratio for cooling component n of the multiple adjustable cooling components is dynamically derived at runtime over the range of speed control settings of adjustable cooling component n.

5. The method of claim 1, wherein the obtaining the weighting ratio comprises obtaining a weighting ratio of cooling effectiveness of cooling component n to total power consumption of the multiple adjustable cooling components, plus power consumption of the electronic system being cooled by the cooling system.

6. The method of claim 1, wherein the proportional gain for adjustable cooling component n is, in part, a function of a measured time constant ($\tau_n$) associated with changes in cooling component n.

7. The method of claim 1, wherein at least two cooling components of the multiple adjustable cooling components have different respective values of weighted cooling effectiveness and are different types of cooling components.

\* \* \* \* \*